United States Patent
Jaroszynski et al.

(10) Patent No.: US 12,181,540 B2
(45) Date of Patent: Dec. 31, 2024

(54) MAGNETOMETER FOR LARGE MAGNETIC MOMENTS WITH STRONG MAGNETIC ANISOTROPY

(71) Applicant: The Florida State University Research Foundation, Inc., Tallahassee, FL (US)

(72) Inventors: Jan J. Jaroszynski, Tallahassee, FL (US); George Miller, Tallahassee, FL (US); David Larbalestier, Tallahassee, FL (US); Anca-Monia Constantinescu, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 425 days.

(21) Appl. No.: 17/804,297

(22) Filed: May 26, 2022

(65) Prior Publication Data

US 2022/0381854 A1    Dec. 1, 2022

Related U.S. Application Data

(60) Provisional application No. 63/193,218, filed on May 26, 2021.

(51) Int. Cl.
*G01R 33/09* (2006.01)
*H01L 43/02* (2006.01)
*H01L 43/10* (2006.01)
*H10N 50/80* (2023.01)

(52) U.S. Cl.
CPC ........... *G01R 33/096* (2013.01); *H10N 50/80* (2023.02)

(58) Field of Classification Search
None
See application file for complete search history.

(56) References Cited

U.S. PATENT DOCUMENTS

| 5,491,411 A | 2/1996 | Wellstood et al. |
| 2009/0006015 A1 | 1/2009 | Mueller et al. |

FOREIGN PATENT DOCUMENTS

EP    3203907 B1    9/2019

OTHER PUBLICATIONS

International Search Report mailed Mar. 7, 2023.
Written Opinion of the International Searching Authority mailed Mar. 7, 2023.
(Continued)

*Primary Examiner* — Daniel S Larkin
(74) *Attorney, Agent, or Firm* — Eversheds Sutherland (US) LLP

(57) ABSTRACT

This disclosure presents systems, devices, and methods that use magnetometers to measure large magnetic moments with strong magnetic anisotropy. A torque magnetometer may include an actuator driven by a motor, a load cell coupled to the actuator, a rotatable spool having a platform configured to hold a sample of a superconductor material, where the rotatable spool is coupled to the load cell by a first line, a pulley, and a second line extending between the rotatable spool and a counterweight, where the second line is positioned on the pulley. Movement of the actuator may cause the rotatable spool to rotate an angle of the platform relative to a magnetic field about the rotatable spool, and the load cell is capable of measuring the tension on the first line.

20 Claims, 18 Drawing Sheets

(56) References Cited

OTHER PUBLICATIONS

Otani et al., "High field torque magnetometer for superconducting magnets", Japanese Journal of Applied Physics, Apr. 1987, vol. 26, No. 4, pp. 623-626 and figures 1-3.
Pechan et al., "Variable Temperature Ultralow Compliance Torque Magnetometer", Review of Scientific Instruments, 1993, vol. 64, No. 3, pp. 802-805. pp. 802, 803, and figure 1.

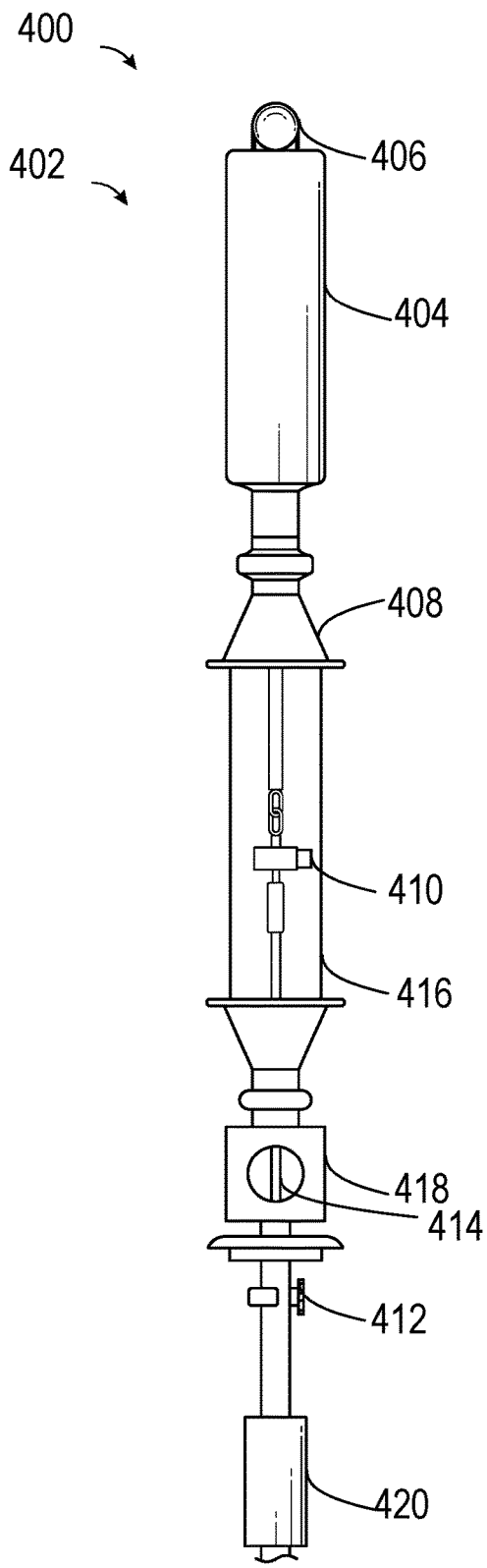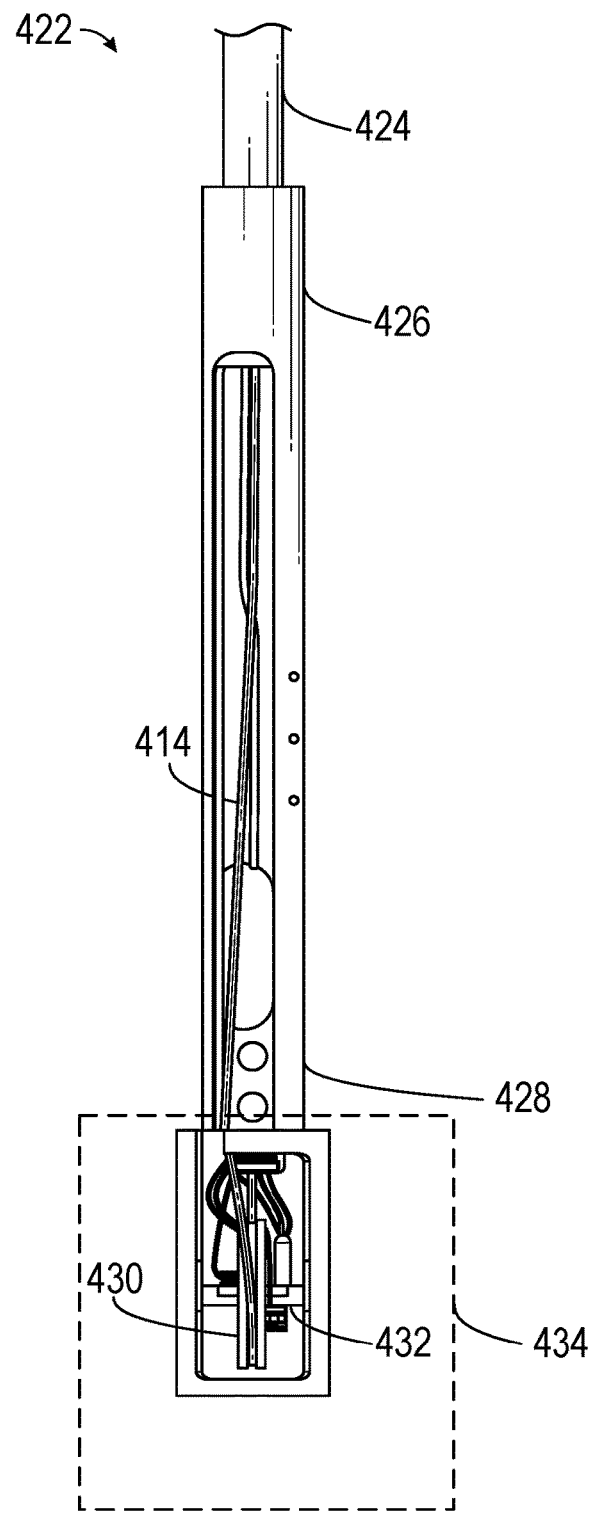
FIG. 4A
FIG. 4B

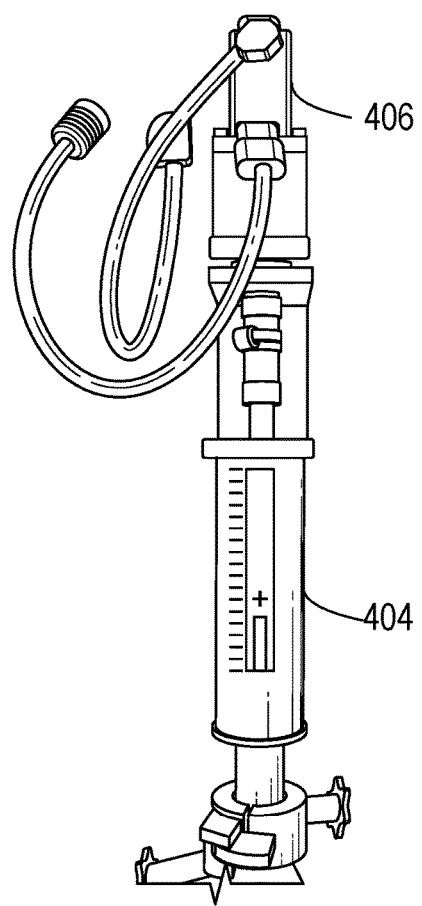
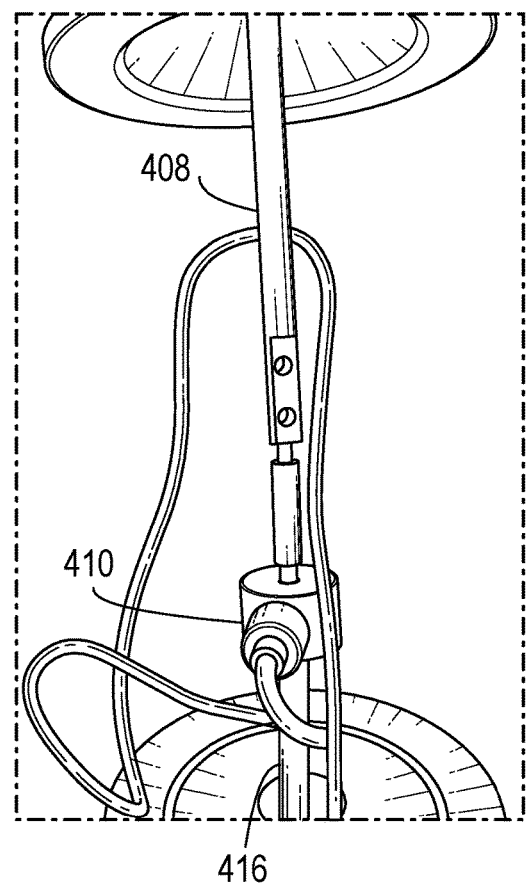
FIG. 5A
FIG. 5B

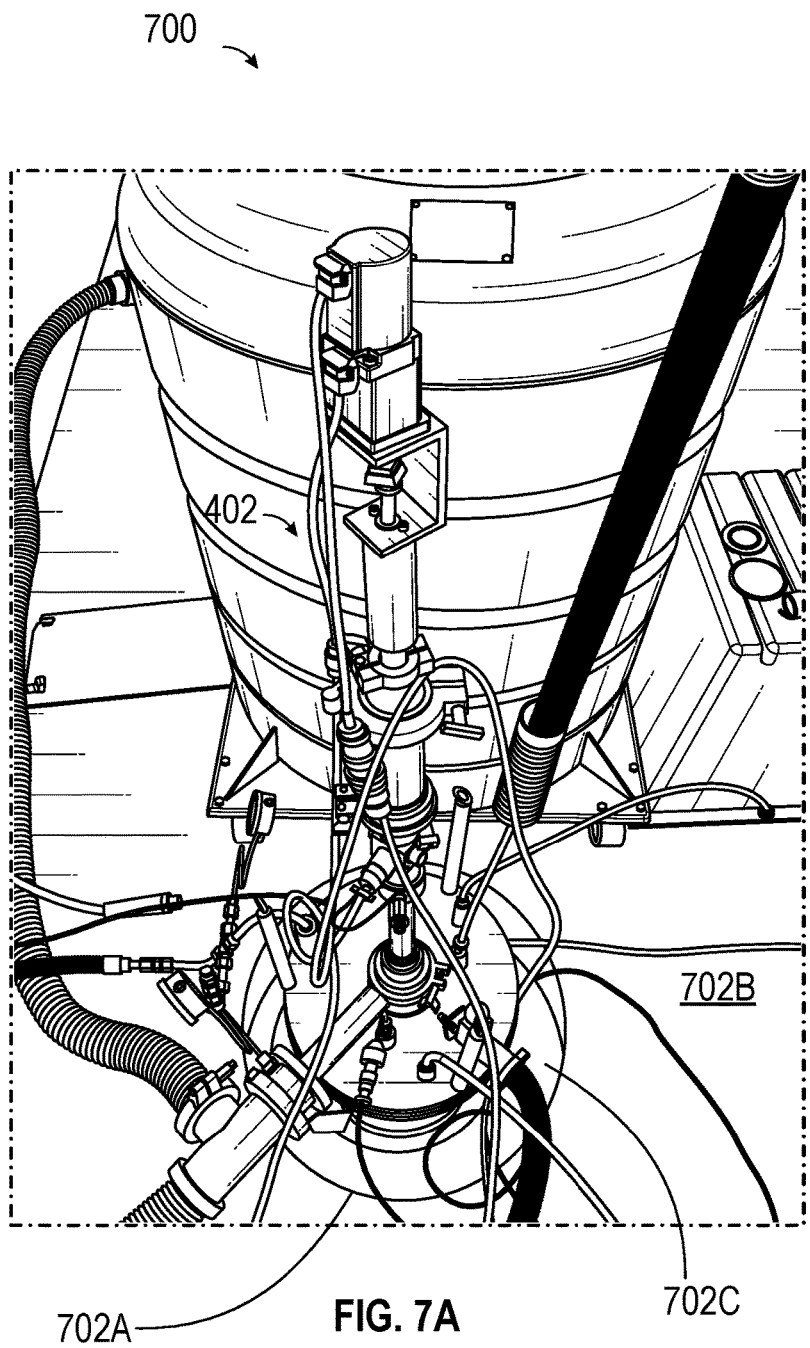
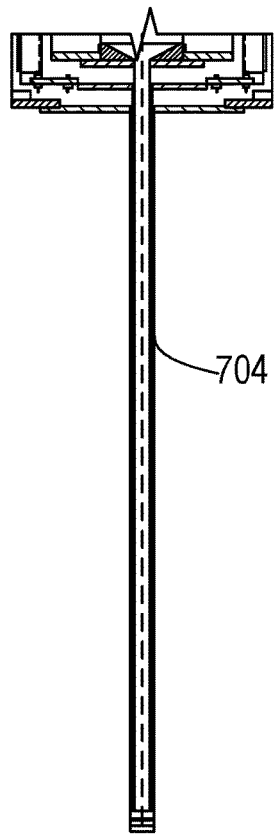
FIG. 7A
FIG. 7B

MAGNETOMETER FOR LARGE MAGNETIC MOMENTS WITH STRONG MAGNETIC ANISOTROPY

CROSS-REFERENCE TO RELATED APPLICATIONS

This application claims priority to U.S. Provisional Application No. 63/193,218, filed May 26, 2021, which is incorporated herein by reference.

STATEMENT REGARDING FEDERALLY SPONSORED RESEARCH AND DEVELOPMENT

This invention was made with government support under contract DMR-1644779 awarded by the National Science Foundation. The government has certain rights in the invention.

BACKGROUND

Second-generation high temperature superconductor tapes (2G HTS tapes), also known as rare-earth barium copper oxide (REBCO) coated conductors, are based on the superconducting compound $REBa_2Cu_3O_{7-x}$. 2G HTS are rapidly being developed and tape production has approached thousands of kilometers of tape per year. 2G HTS has various applications, including power cables with superior energy efficiency, fault current limiters, transformers, motors, generators, energy storage systems, and stronger electromagnets. The (engineering current density)×(usable length) mathematical product, which defines conductors' performance, has roughly doubled every two years. However, despite developments in manufacturing, 2G HTS and their characteristics are far from being thoroughly understood.

Superconductors are capable of carrying electric currents with virtually no energy dissipation (that is, zero resistance), provided that these currents are smaller than a certain critical current $I_c$. This critical current may depend on the morphology of the conducting materials and on the following external parameters: an applied magnetic field, a temperature, and an angle θ between the conductor's c-axis (normal to the sample's ab-plane) and the magnetic field. Typical commercial 2G HTS having a 4 mm×0.1 mm cross-section can carry a current of 2 kA at a liquid helium temperature of, for example, 4.2 K, for a magnetic field of 30 T and a tape tilt in the magnetic field of θ=90 degrees. In some cases, currents of 6 kA may be carried given these external parameters. The progress in 2G HTS manufacturing has made possible the development of the all-superconducting 32 Tesla (T) user magnet prototypes, and recent measurements of short and narrow samples have indicated no dramatic downturn of the REBCO properties at magnetic fields of up to 45 T. These results are highly promising for achieving 40 T user magnets and for upgrading high-energy particle accelerators by employing 20+T accelerator-grade magnets.

Construction of stronger electromagnets requires that conductors are comprehensively characterized mechanically and electromagnetically. Based on the resistive method, $I_c$ is determined as the current producing a critical value of the voltage $V_c$, where $V_c$ is conventionally set to 10 or 1 µV. The voltage-current characteristic is highly nonlinear and is based on the following formula: $(V=V_c(I/I_c)^n)$. The currents and voltages involved can be measured fairly easily. However, the resistive technique is not suitable to measure the phenomenally high currents transported by 2G HTS at very high magnetic fields due to the difficulty to deliver kilo-ampere currents to samples inserted in the very limited available space inside a cryostat, especially when the samples are mounted on rotating platforms. Few reliable measurements have been obtained at high magnetic fields (more than or equal to 20 T), low temperatures (less than or equal to 30 K), and large angles (where the direction of the magnetic field is close to or in the sample plane B∥ab). These inadequately explored regions of the magnetic field, temperature, and angle parameters are exactly the ranges where high-field magnets operate. 2G HTS characteristic data in these ranges are essential for high field magnet design advancement. For instance, in strong magnetic fields (greater than 30 T), REBCO's $I_c$ decays very fast around B∥ab, and its anisotropy reaches values of at least 20 at 45 T, thus limiting the performance of a high field magnet constructed from such a material.

Further, in addition to negatively affecting current leads and joints, substantial Joule heating leads to inadequate temperature stabilization. Local overheating at defective spots due to strong nonlinearity $E \propto I^n$ can produce a substantial localized electric field E which, although barely contributing to the overall voltage measured on the voltage taps, can create localized heating that may degrade or even destroy samples during measurement. Additionally, overheating increases the liquid helium boil-off, thus causing a build-up helium gas bubble when the liquid helium is diamagnetically repelled from the magnetic field center. This may cause inefficient cooling of the samples, thus altering experimental results.

Additionally, it should be noted that mechanical strength, and not only the $I_c$, also limits a coated conductor's magnet's performance. The current carried by 2G HTS may be limited by cross-sectional defects induced by high electromagnetic forces, especially tilted Lorentz forces arising at the ends of the magnet coil, where radial fields are high and deformation and peeling of the tape's edges may occur. Notably, edges are the weakest part of 2G HTS tapes due to the mechanical slitting step that is undergone during manufacturing. More specifically, cracks may form at the tape's edges during the mechanical slitting step, and the cracks may propagate into the tapes when stress occurs.

In addition, electromotive forces arising from magnetic flux changes may induce screening currents which are already of the order of the $I_c$ at the beginning of the magnet energization. These screening currents circularly flow in the plane of the coated conductors, thus exerting strong torques on them, particularly at their edges. These screening currents may result in the destruction of the coated conductor.

It is with respect to these and other considerations that the disclosure made herein is presented.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

FIG. 4A illustrates an upper portion of an exemplary magnetometer in accordance with the principles of the present disclosure.

FIG. 4B illustrates a lower portion of an exemplary magnetometer in accordance with the principles of the present disclosure.

FIGS. 5A-D illustrate close-up depictions of various components of the magnetometer depicted in FIG. 4A in accordance with the principles of the present disclosure.

FIGS. 7A-B depict a magnetometer mounted in a high-field cryostat in accordance with the principles of the present disclosure.

DETAILED DESCRIPTION

Overview

Figure 1:
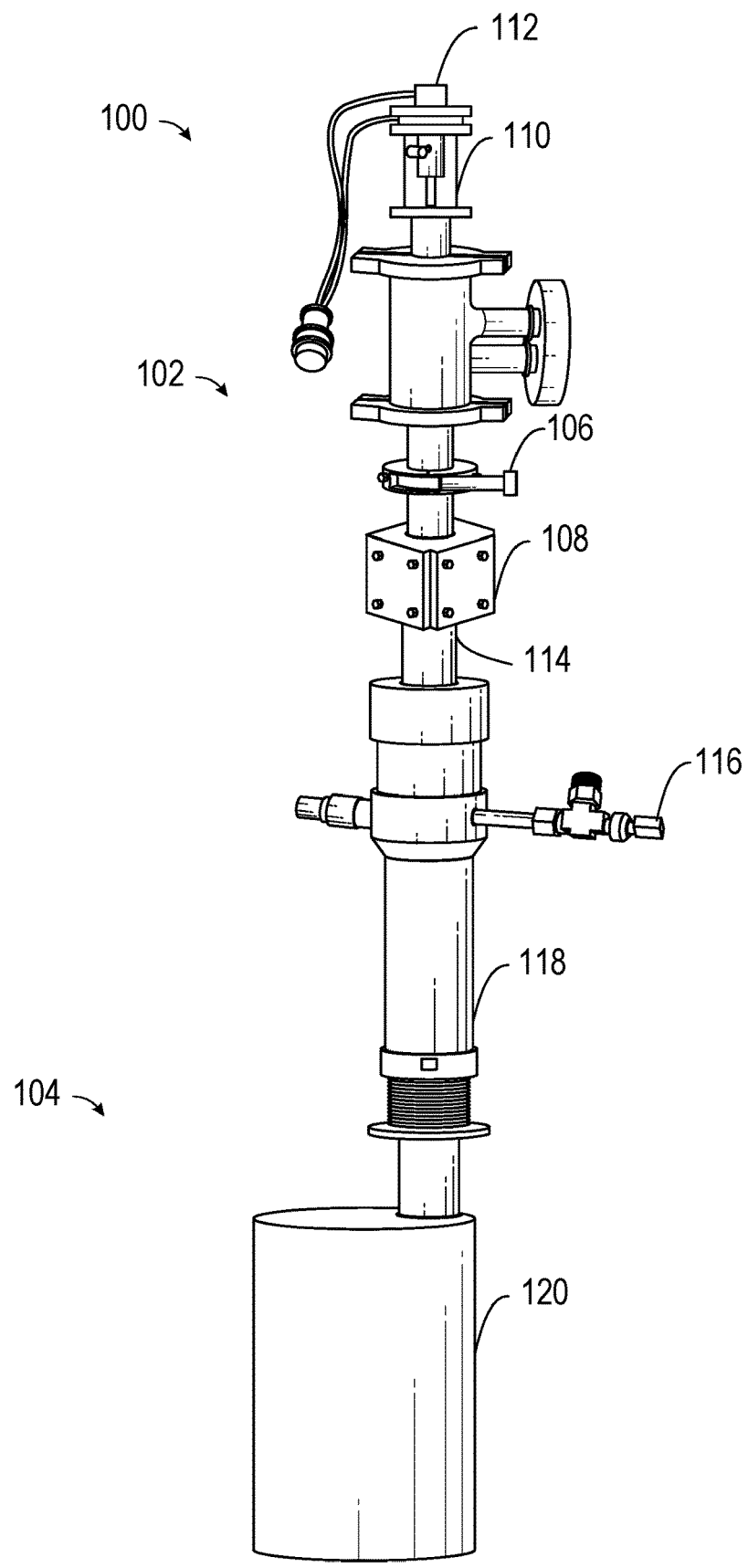
FIG. 1 illustrates an exemplary magnetometer in accordance with the principles of the present disclosure.

This disclosure presents systems, devices, and methods to characterize and measure strong anisotropic magnetic moments of up to approximately 100 electromagnetic units (emu) at the highest available continuous magnetic fields (approximately 30 T-45 T) at cryogenic temperatures.

Existing instruments for characterizing 2G HTS tapes in extreme condition are limited to measure anisotropic magnetic moments of approximately 1 emu due to a lack of space inside high-field cryostats and large forces. However, large samples having magnetic moments significantly higher than 1 emu are necessary to assess very high critical currents $I_c$ exhibited by performant superconductor films in order to enable discriminating between irreversible magnetization (induced currents, which are proportional with dimensions of the sample of the superconductor material) and reversible magnetization (superconducting vortices, which are not proportional with dimensions of the sample of the superconductor material), and characterizing these superconductors in similar environments as those environments that such superconductors are subject to when functioning as part of a superconducting device. The characterization of such superconductors in appropriate environments is critical because the electromagnetic and mechanical properties of high-temperature superconductors are strongly entangled and are dependent on the dimensions of the sample of the superconductor material.

Thus, the systems, devices, and methods disclosed herein provide for fast and effective electromechanical characterization of second-generation high temperature superconductors (2G HTS) tapes in extreme conditions, such as magnetic fields of over 30 T (for example, in projects involving 32 T and 40 T all-superconducting magnets) and temperatures of approximately 30 Kelvin (K) and lower. These 2G HTS are able to carry high density electrical currents, and they may have the potential to revolutionize technologies related to fusion generation, energy systems, transportation, medicine, environmental protection, and a variety of other applications. However, the properties of 2G HTS are still not well understood because they are difficult to characterize, especially under high magnetic fields at low temperatures. For example, the ability of 2G HTS to carry kiloampere currents may render the 2G HTS difficult to characterize in high magnetic fields when other methods are used. Thus, the systems, devices, and methods disclosed herein further the existing understanding of the properties of 2G HTS tapes. Notably, the systems, devices, and methods disclosed herein can be further used to characterize other types of superconducting and magnetic materials in extreme conditions, including almost all laboratory magnets.

In accordance with the present disclosure, a method to assess the critical current ($I_c$) of a superconductor material may utilize the torque exerted on the coated conductors by otherwise parasitic inductive screening currents. The torque is proportional to the magnetic moment $\vec{m}$ induced in the sample by the external magnetic field and the external magnetic field itself, and the torque is determined by: $\vec{\tau} = \vec{m} \times \vec{B}$ ($\tau = mB \sin \theta$), where $t$ represents torque, $B$ represents the magnetic field, and $\theta$ represents an angle between a c-axis of the sample of the superconductor material and the magnetic field. In turn, the magnetic moment $m$ is proportional to the screening current induced in the sample of the superconductor material and a coefficient that represents a geometrical factor and the current distribution. This coefficient can be assessed numerically or experimentally by comparing corresponding critical current $I_c$ values obtained with inductive and resistive techniques. Thus, knowing the torque value, the critical current can be accurately assessed. This contact-less method further solves many of the experimental issues encountered during resistive measurements, such as current delivery and Joule heating.

Several existing magnetometers can be used to measure either torque or magnetic moment. For example, one is a commercial vibrating sample magnetometer (VSM), in which a magnetized sample of a superconductor material vibrates between pickup coils, thus inducing an electric signal. More specifically, the magnetized sample of the superconductor material is sinusoidally vibrated, inducing voltage in a nearby pickup coil(s). Ideally, this voltage is proportional to the magnetic moment of the sample. However, when these coils are placed in the center of a resistive, 20 MW water-cooled magnet, they may pick up substantial electromagnetic noise, which may interfere with the voltage measurement.

Vibrating sample magnetometers suffer from various drawbacks including, for example, high torques that interfere with movement of a sample of a superconductor material, causing the driving shaft to bend. Further, due to the configuration and dimensions of the VSM, in-situ sample rotations can be achieved only in a split magnet, which limits measurements to magnetic fields under 15 T. Additionally, electrical measurements at the center of the magnet may be sensitive and suffer from substantial electromagnetic and vibrational interference. When attempts to assess critical current in a 1 mm×1 mm 2G HTS sample were made by means of magnetization measured by a commercial vibrating sample magnetometer, the measurements were found to be inaccurate in stronger magnetic fields, especially at small angles. Measurements with the magnetic field closer to the plane of the sample was impossible with vibrating sample magnetometers. Moreover, the rotation of the sample using the vibrating sample magnetometer was ex-situ, so obtaining a series of measurements may take a few days.

Another example is a cantilever torque magnetometer, which measures capacitively or piezoresistively the cantilever deflection induced by the torque of the sample of the superconductor material. Notably, cantilever torque magnetometers further need special setups in order to measure small signals in a noisy environment. Further, these magnetometers are unable to measure strong magnetic moments—cantilever torque magnetometers were developed to measure relatively smaller (less than $10^{-3}$) magnetic moments, which is possible only with small 2G HTS samples. However, in an experiment, the high noise and high torques (that cause a VSM rod to bend) could not be mitigated, and no in-situ rotator was available. As a result, the measurements obtained via the cantilever torque magnetometer were tedious and inaccurate. Cantilever torque magnetometers suffer drawbacks including, for example, only producing relative measurements because performance is based on mechanical cantilever/shaft properties, limitations on measured magnetic moments due to the cantilever's elastic limits, and electrical measurements at the center of the magnet being sensitive and having substantial electromagnetic and vibrational interference.

A third example is an apparatus similar to a cantilever torque magnetometer, in which a magnetic torque induces, torsionally, the deflection of a cylindrical sample holder, which is measured by strain gauges. This apparatus suffers from several drawbacks including, for example, only producing relative measurements as performance is based on mechanical cantilever/shaft properties and requiring a split magnet although cantilever torque magnetometers can be easily rotated in-situ.

Moreover, resistive methods, also known as transport methods, suffer from various drawbacks including, for example, failing at low magnetic fields (due to high currents), failing at high magnetic fields and angles (due to sample degradation because of highcurrents and forces), failing at temperatures between 4.2 K and 20 K (due to overheated samples disposed in helium gas), issues with delivering high currents to in-situ rotating platforms, substantial liquid helium consumption requirements due to high currents and heavy current leads, and tedious sample preparation processes that are necessary to reduce currents (because the samples must be narrow due to full-width sample measurement being impossible).

Accurately assessing if conductors are suitable for magnet construction requires the characterization of full-width tapes (with the length/width aspect ratio being as high as possible) rather than small tape pieces. This allows for a better assessment of the entanglement of mechanical and electromagnetic properties of 2G HTS in a real magnet by simulating forces that are similar to the ones exerted on the conductor during magnet operation. Further, the torque from screening current normalized per sample volume will be proportional to the sample width, unlike a reversible torque or volume arising from tilted vortices, which is constant. Thus, the use of large samples strongly suppresses the contribution from the tilted vortices. Moreover, the inductive method utilizes the screening currents, which affect magnet field stability and homogeneity. For extremely high critical currents, these screening currents can be critically destructive by inducing stresses that could overcome the conductor's strength limits. Because these inductive methods use screening currents, the energy dissipation levels correspond to normal magnet operation. Critical currents measured resistively are on the order of microvolts per centimeter, thus making the milliwatt dissipation power essential for quench analysis and protection.

Further, magnetometers constructed to measure large samples in low temperature ranges require an external magnetic field perpendicular to the magnetometer's probe. This can be done with spilt magnets, but the strongest magnetic field produced by these is still much smaller than the magnetic fields needed for measurements relevant for high-field magnet development.

Thus, the systems, devices, and methods disclosed herein describe a solution for better and faster characterization of coated conductors of suitable sizes, so as to more accurately predict the behavior of coated conductors in real magnets during operation.

First, mapping uncharted portions of the $I_c(B, T, \theta)$ parameter space (that is, obtaining full angular data at low temperatures and high magnetic fields) has the potential to explain the physics of pinning, which is still not well understood. Existing analytical and numerical calculations inadequately describe materials that display a larger number of vortices than their number of pinning sites. Moreover, the observed power function $I_c \propto B^{-\alpha}$, where B represents the magnetic field, and where α represents a fitting parameter between 0.5 and 1, involves a dependence of the critical current on α that is only qualitatively explained. The increase of α with increased density of the columnar defects from $BZrO_3$ doping and its decrease with increasing columnar defects induced by irradiation is an unsolved puzzle as well.

Additionally, a complete $I_c(B, T, \theta)$ set of data is critical for magnet construction and technical advancement. In particular, missing $I_c(B, T, \theta)$ data prevents the understanding of how pinning variations and defects (which are well known at elevated temperatures, for example, 77 K in liquid nitrogen) influence the low-temperature properties of the coated conductors. More specifically, the "anti-correlation" defects in superconducting tapes resulting from temperature variations during the production process are not well understood at low temperatures, although $I_c$ fatal dropouts may be potentially induced in the magnets' windings. Therefore, eliminating defective conductors based on liquid nitrogen data is critical. However, while commercial devices may be available to identify defects along long REBCO conductors at approximately 77 K by measuring remnant magnetization using Hall probes, such commercial devices may not be capable of operating at temperatures of approximately 4.2 K or lower.

Further, fast $I_c$ measurements in low temperatures may also aid in the thorough characterization of samples obtained by different procedures, which is helpful for progress in the field of material science. The torque magnetometer disclosed herein can perform 5-7 full angular scans per hour; that is, in one hour it can measure the angular $I_c$ at 5-7 different magnetic fields, for a set temperature. This may provide a full characterization of $I_c(B, T, \theta)$ data per working day, per sample. The full automation of the measurements further may allow the complete characterization of two samples in a day. The speed of characterization may also improve magnet design and the existing understanding of the performance and failure features of already constructed prototypes.

Specifically, systems, devices, and methods are provided that allow measurement of the properties of superconductors based on high temperature superconductivity by means of torque magnetometry. The systems and devices are further able to characterize magnetic and superconducting materials that carry strong magnetic moments at low magnetic fields and high magnetic fields of up to 45 T and other higher steady magnetic fields. This approach allows for direct measurement of electromagnetic forces and assessments of critical current for across any external magnetic fields, temperatures, field orientations, and angles between the applied magnetic fields and relevant axes of the sample's crystalline structure. Notably, the systems, devices, and methods disclosed herein operate approximately twenty times faster than similar instruments, produce a higher signal-to-noise ratio, and are capable of measuring anisotropic samples having magnetic moments that are approximately 100 times than higher than when similar instruments are used. Further, while such systems, devices, and methods were developed for extremely high field magnets, they are also fully compatible with practically any laboratory magnet.

The systems, devices, and methods described herein further outperform similar instruments by solving the various issues encountered when using resistive $I_c$ measurement techniques, including the ability to deliver high currents to samples mounted on rotating platforms, sample degradation, and other issues. The systems, devices, and methods described herein additionally substantially outperform similar instruments by measuring over much wider ranges of magnetic fields, angles, and temperatures, delivering a higher signal-to-noise ratio, performing measurements about 20 times faster, thus substantially reducing experimentation time and consumption of cryogens (for example, liquid helium) and energy, and delivering massive sets of data from various samples in a short time.

Other benefits of the torque magnetometer disclosed herein include compatibility with any magnet with a cold bore of 1.5 inches or larger (including the 32 T resistive and superconducting 15 T magnets). Moreover, the torque magnetometer may be scaled to fit in the 45 T hybrid magnet's bore. The torque magnetometer may conduct measurements with a load cell that is a precisely NIST (National Institute of Standards and Technology) calibrated sensor. The torque magnetometer may provide full in-situ rotation about 360 degrees and may provide continuous angular measurements. It may allow for improved sample temperature control and, thus, facilitate temperature-dependent measurements. The torque magnetometer may allow for contactless measurements, thus avoiding sample destruction during measurement, and it covers regions where resistive methods fail. The torque magnetometer may facilitate the determination of a main crystallographic direction, which is difficult with the transport method. Additionally, the torque magnetometer is capable of operating from medium magnetic fields (approximately 3 T) to high magnetic fields (up to 45 T) at all angles, and a large temperature range from 4 K to 50 K.

Illustrative Embodiments

The disclosure will be described more fully hereinafter with reference to the accompanying drawings, in which example embodiments of the disclosure are shown. This disclosure may, however, be embodied in many different forms and should not be construed as limited to the example embodiments set forth herein. It will be apparent to persons skilled in the relevant art that various changes in form and detail can be made to various embodiments without departing from the spirit and scope of the present disclosure. Thus, the breadth and scope of the present disclosure should not be limited by any of the above-described example embodiments but should be defined only in accordance with the following claims and their equivalents. The description below has been presented for the purposes of illustration and is not intended to be exhaustive or to be limited to the precise form disclosed. It should be understood that alternate implementations may be used in any combination to form additional hybrid implementations of the present disclosure. For example, any of the functionality described with respect to a particular device/component may be performed by another device/component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments.

Certain words and phrases are used herein solely for convenience and such words and terms should be interpreted as referring to various objects and actions that are generally understood in various forms and equivalencies by persons of ordinary skill in the art.

Referring now to FIG. 1, an exemplary magnetometer 100 is provided. The magnetometer 100 may include an upper portion 102 and a lower portion 104. The upper portion 102 imparts movement on a sample of a superconductor material which is disposed on a rotatable platform, which may include 360 degrees of motion. The lower portion 104 may be removably enclosed in a cryostat 120. Inside the cryostat 120, the sample of the superconductor material is subjected to varying temperatures, magnetic fields, and relative rotational positions. The upper portion 102 may include an actuator 110. The actuator 110 may be driven by a motor 112. The actuator 110 may be configured to rotate a platform of a rotatable spool disposed within the lower portion 104. In some embodiments, the actuator 110 may be configured to rotate the platform in predetermined increments. The actuator 110 may be further coupled to a load cell chamber 106, which may contain a load cell. The load cell chamber 106 may be connected to an electric connector cube 108, which may be further coupled to a quick connector 114. In some embodiments, the electric connector cube 108 may contain electric connectors configured to connect wires from the various sensors of the magnetometer 100, for example, thermometers, heaters, the load cell and other components, to external cables that may be connected to various instruments, for example, a temperature controller, a voltmeter, or other applicable equipment. The quick connector 114 may be additionally coupled to a valve 116 configured with a pumping line and a vacuum can 118. In some embodiments, the valve 116 may be configured to remain closed unless air is being pumped out from the vacuum can 118 by a pump, or gas, for example, helium exchange gas, is being added to the vacuum can 118. In some embodiments, the vacuum can 118 may be used to regulate the pressure of the gas surrounding a sample of the superconductor material. In some embodiments, in the precooling stage, the magnetometer 100 may be at least partially immersed in liquid nitrogen, for example, in a liquid nitrogen canister, for a predetermined period of time.

Figure 2:
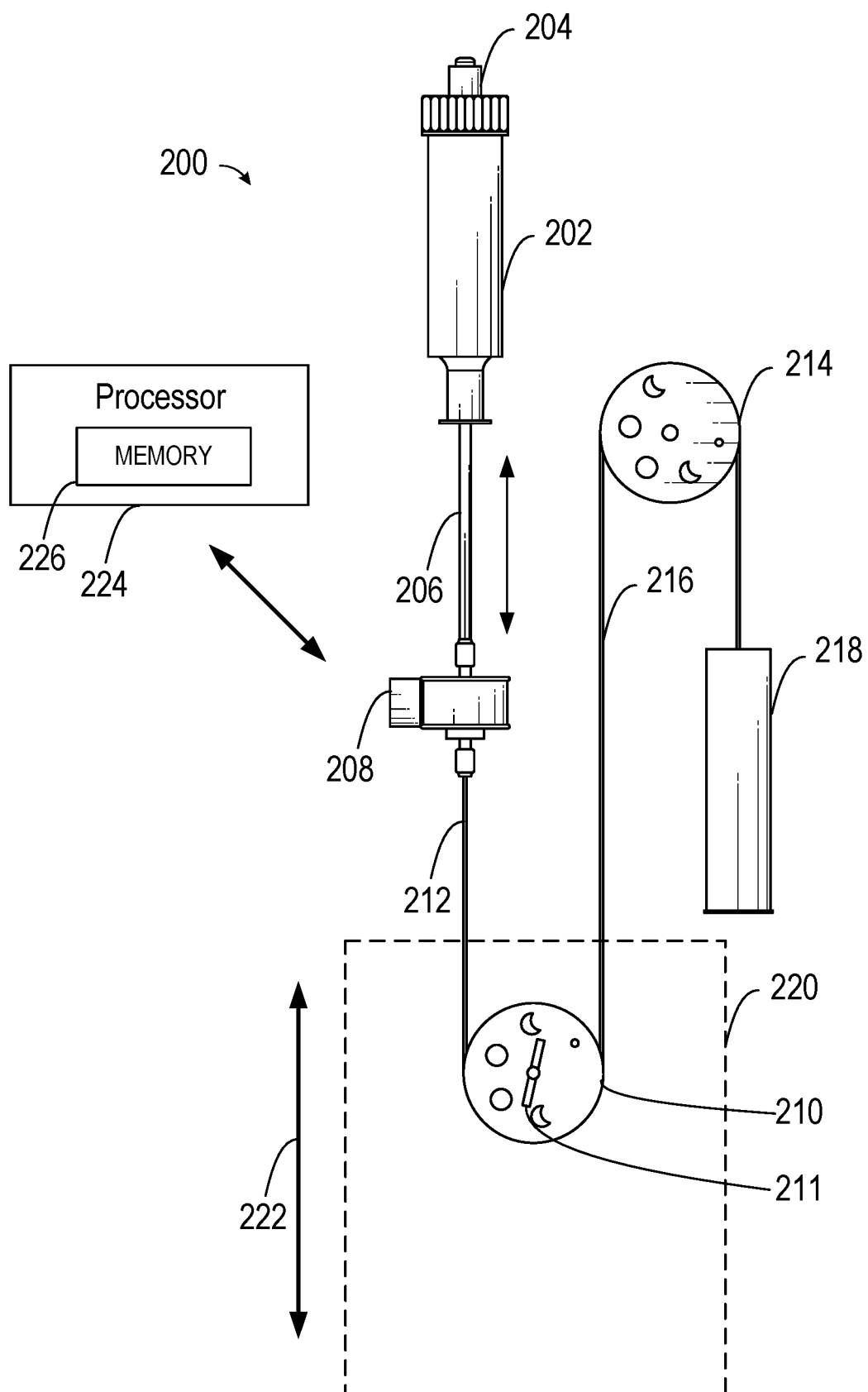
FIG. 2 depicts a schematic depicting an exemplary magnetometer mechanism in accordance with the principles of the present disclosure.

As shown in FIG. 2, a schematic diagram depicting an exemplary magnetometer mechanism 200 in accordance with the present disclosure is provided. An actuator 202 may be disposed in an upper portion of the magnetometer mechanism 200. The actuator 202 may be driven by a motor 204. The actuator 202 may be further connected to a first end of an actuator shaft 206. A second end of the actuator shaft 206 may be connected to a load cell 208. Thus, the load cell 208 may be indirectly coupled to the actuator 202. The load cell 208 may be coupled to a rotatable spool 210 having a platform 211 configured to hold a sample of a superconductor material. The rotatable spool 210 may include a pickup coil disposed above the sample of the superconductor material to determine an angle between an external magnetic field and the sample of the superconductor material. The load cell 208 may be coupled to the rotatable spool 210 by a first line 212. In some embodiments, the distance between the load cell 208 and the rotatable spool 210 may be approximately two meters. The rotatable spool 210 may be further connected to a pulley 214 by a second line 216. In some embodiments, the first line 212 and the second line 216 may be a Kevlar line or another suitable material. In some embodiments, a counterweight 218 may be attached to an end of the second line 216, and the second line 216 may be positioned on the pulley 214. In some embodiments, the rotatable spool 210 may be disposed within a cryostat 220. The load cell 208 may be configured to measure tension in the first line 212. As a result of the configuration of the magnetometer mechanism 200, movement in the actuator 202 may cause the platform 211 to rotate to a first position. At this first position, the application of a magnetic field 222 causes a tension on the first line 212 by the load cell 208. The magnetic field 222 may be applied perpendicularly to a rotation axis of the platform 211 of the rotatable spool 210. Each incremental movement of the actuator places the platform in a different position, resulting in differing tensions on the first line 212 by the load cell 208. In some embodiments, the magnetometer mechanism 200 may further include a processor 224 for determining a critical current of the sample of the superconductor material based on the tension in the first line 212. In some embodiments, the magnetometer mechanism 200 may include a computer having a processor 224 and a memory 226 having a software module configured to perform various calculations based on the differing tensions on the first line 212 and other calculations. The computer may be further configured to generate graphs to visually represent the calculations, for example, as depicted below in FIGS. 11A-B, and present the graphs via a graphical user interface. In some embodiments, the computer may be further configured to be connected to various components of the magnetometer mechanism 200, such as the load cell 208, the actuator 202, the cryostat 220, and/or the pickup coil.

As noted, the load cell 208 may be configured to measure tension in the first line 212. Torque ($\tau$) may be determined in relation to the tension in the first line 212. More specifically, $T=\tau \times R+W$, where T represents the tension in the second line 216, R represents the radius of the pulley 214, and W represents a weight of the counterweight. Further, once torque is calculated, a magnetic moment may be determined in relation to the torque. More specifically, $\tau=m \times B \times \sin(\theta)$, where m represents the magnetic moment associated with the sample of the superconductor material, B represents the magnetic field, and $\theta$ represents an angle between a c-axis of the sample of the superconductor material and the magnetic field.

In some embodiments, a critical current carried by high-temperature superconductors (HTS) may be determined based on the magnetic moment associated with the sample of the superconductor material due to the magnetic field being applied to the magnetometer mechanism 200. For long samples, in which the length of the sample is at least three times the width of the sample, a critical current $I_c$ may be determined by $4 \times m/(w \times l)$, where m represents a magnetic moment associated with the sample of the superconductor material, w represents the width of the sample of the superconductor material, and l represents the length of the sample of the superconductor material. In some embodiments, the actuator 202 may be configured to vary the angle between the crystallographic axis (also known as a c-axis) of the sample of the superconductor material and the magnetic field. In some embodiments, the c-axis may be perpendicular to a film on the sample of the superconductor material. The actuator 202 thus facilitates two modes of measurement: (1) varying magnetic field strengths at a fixed angle, and (2) varying angles at a fixed magnetic field.

Figure 3:
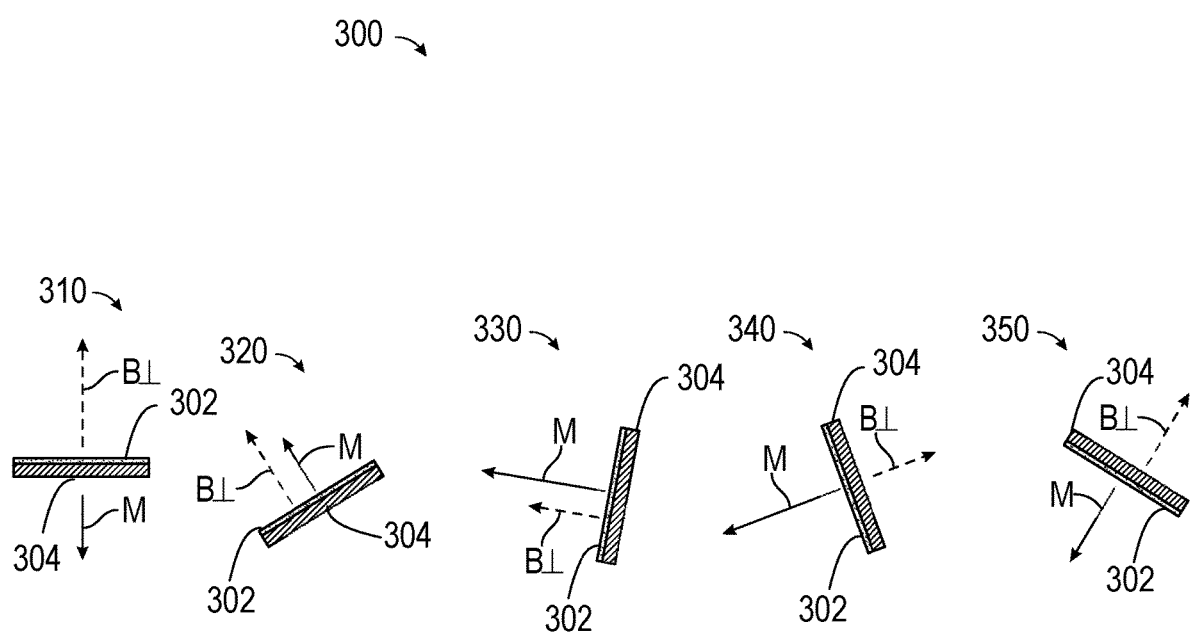
FIG. 3 illustrates a schematic for illustrating the perpendicular component of an external magnetic field and the magnetic moment produced by currents induced in the sample of the superconductor material in accordance with the principles of the present disclosure.

As shown in FIG. 3, a schematic 300 for illustrating the perpendicular component of an external magnetic field and the magnetic moment produced by currents induced in the sample of the superconductor material is provided. The schematic 300 may involve changing a perpendicular component of the magnetic field by rotating the sample 302 of the superconductor material in a constant total external magnetic field. Initially, at schematic 310, a magnetic field of 30 T may be applied in an upwards direction. In a first position, where the angle $\theta$ of the platform 304 is 0 degrees, a total field on a perpendicular direction to the sample 302 of the superconductor material may be upwards, while a magnetic moment may point downwards and in the opposite direction. At schematic 320, as the sample 302 of the superconductor material is rotated and $\theta$ increases, the total field on the perpendicular direction to the sample 302 of the superconductor material decreases. The magnetic moment may be reversed and may point in the same direction as the magnetic field, which is perpendicular direction to the sample 302 of the superconductor material.

At schematic 330, as the sample 302 of the superconductor material is further rotated and $\theta$ continues to increase, a point is reached where the total field on the perpendicular direction to the sample 302 of the superconductor material continues to decrease, and the magnetic moment may reach its critical state. At schematic 340, if the sample 302 of the superconductor material continues to be rotated after the critical state is fully developed, the total field on the perpendicular direction to the sample 302 of the superconductor material may be flipped to point in an upwards-facing direction and may increase. While the magnetic moment may remain in its critical state in such a configuration, it is not necessary for the total field on the perpendicular direction to the sample 302 of the superconductor material to be flipped in order to achieve a fully-developed critical state. Further, because the magnetization vector changes direction in the laboratory coordinates, but not in the sample coordinates, as the sample of the superconductor material is rotated and its plane crosses the magnetic field, no reversal of the magnetization vector is caused, and the sample 302 of the superconductor material may remain in a fully developed critical state. At schematic 350, the continued rotation of the sample 302 of the superconductor material by up to 180 degrees may result in a decrease in the magnetic moment as the total field on the perpendicular direction to the sample 302 of the superconductor material increases.

In some embodiments, the external magnetic flux through a sample 302 of the superconductor material may be determined by: $\vec{\Phi} = \vec{B}\vec{n}S$, where $\Phi = BS \cos\theta$. In this formula, $\Phi$ represents the magnetic flux, B represents the applied magnetic field, S represents an area of the surface, and $\theta$ represents an angle between a perpendicular direction to the surface and the applied magnetic field. Further, $\vec{\Phi}$ represents a magnetic flux vector, $\vec{B}$ represents a magnetic inductance vector, $\vec{n}$ represents a vector that is normal to the superconductor plane, and S represents an area of the surface.

A change in flux may be calculated by: $d\Phi = S\cos(\theta)dB - BS\sin(\theta)d\theta + B\cos(\theta)dS$. However, in the event that the last term ($B\cos(\theta)dS$) corresponds to a particular situation, such as the sample of the superconductor material being bent, the last term may be omitted. Under such circumstances, the change in flux may be calculated by: $d\Phi = S\cos(\theta)dB - BS\sin(\theta)d\theta$. As a result, the total magnetic field change on a perpendicular direction to the sample of the superconductor material is determined by: $dB \equiv \cos(\theta)dB - B\sin(\theta)d\theta$. If $\theta$ is constant and without change, then the total magnetic field change on the perpendicular direction to the sample of the superconductor material is determined by: $dB_\perp = \cos(\theta)dB$, where the total $dB_\perp$ change is determined by: $\Delta B_\perp = \Delta B \cos(\theta)$. Where $\Delta B = 30$ T and $\theta$ is 84 degrees (such that $\cos(\theta) = 0.1$), the total yield for $\Delta B_\perp$ is 3 T. However, when the sample of the superconductor material is rotated in a constant magnetic field B, the total $dB_\perp$ change is determined by:

$$\Delta B_\perp = -B\int_{\theta_1}^{\theta_2}\sin(\theta)d\theta = -B\cos(\theta)|_{\theta_1}^{\theta_2} = B(\cos(\theta_1) - \cos(\theta_2)).$$

If the magnetic field $B = 30$ T, and the sample of the superconductor material is rotated between $\theta_1 = 0$ degrees and $\theta_2 = 84$ degrees, the total yield for $\Delta B_\perp$ is 27 T. It should be noted that the range of rotation between $\theta_1 = 0$ degrees and $\theta_2 = 84$ degrees should be more than sufficient to establish a fully-developed critical state. This illustrates that magnetic moment does not change direction even when the sample is rotated beyond 90 degrees in a magnetic field, so the fully-developed critical state is maintained even when the sample is rotated beyond 90 degrees, thus enabling critical current calculations to take place.

Figure 5C:
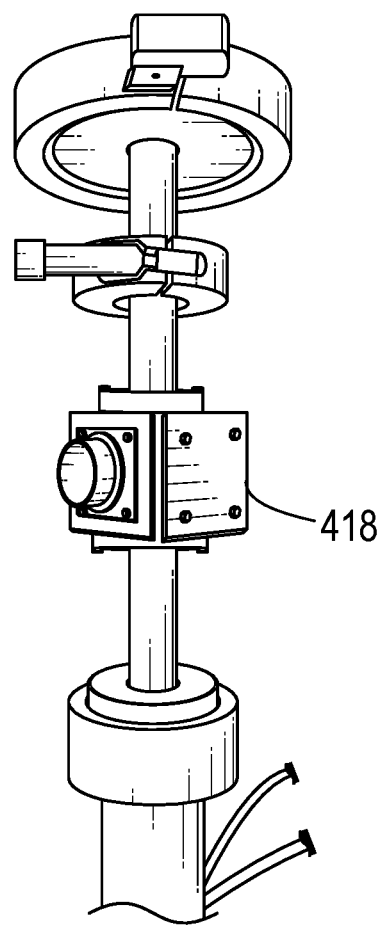

As shown in FIGS. 4A-B, portions of an exemplary magnetometer 400 are provided. As shown in FIG. 4A, an upper portion 402 of the magnetometer 400 is shown. The upper portion 402 may include an actuator 404. In some embodiments, the actuator 404 may be a Standard 4" Travel, Manual Drive Linear Motion Feedthrough by MDC Vacuum Products. The actuator 404 may be driven by a motor 406. In some embodiments, the motor 406 may be a computer-controlled brushless servo motor that is capable of driving the actuator 404 with a wide range of speed values. A more detailed illustration of the actuator 404 and the motor 406 is additionally provided in FIG. 5A.

Figure 5D:
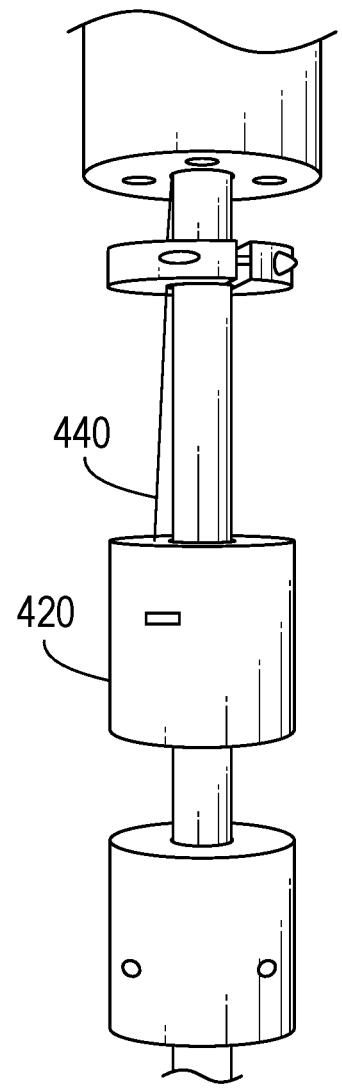

The actuator 404 may be coupled to an actuator shaft 408, which is then further coupled to a load cell 410. In some embodiments, the load cell 410 may be an Interface Model WMC Stainless Steel Miniature Load Cell 220 N. The load cell 410 may be connected to a pulley 412 via a first end of a first line 414. The first line 414 may be further configured to pass through an aluminum shaft 416 and an electric connector cube 418. A more detailed illustration of the actuator shaft 408, the load cell 410, and the aluminum shaft 416 is additionally provided in FIG. 5B. A more detailed view of the electric connector cube 418 is additionally depicted in FIG. 5C. The aluminum shaft 416 may be disposed on top of the electric connector cube 418. A second end of the first line 414 may be coupled to a second line that is coupled to a counterweight 420. A more detailed view of the counterweight 420 may be additionally depicted in FIG. 5D. In some embodiments, the counterweight may be a 7 N weight, or may be another weight. In some embodiments, the counterweight may be tied to a second line 440.

Figures 6A, 6B, 6C:
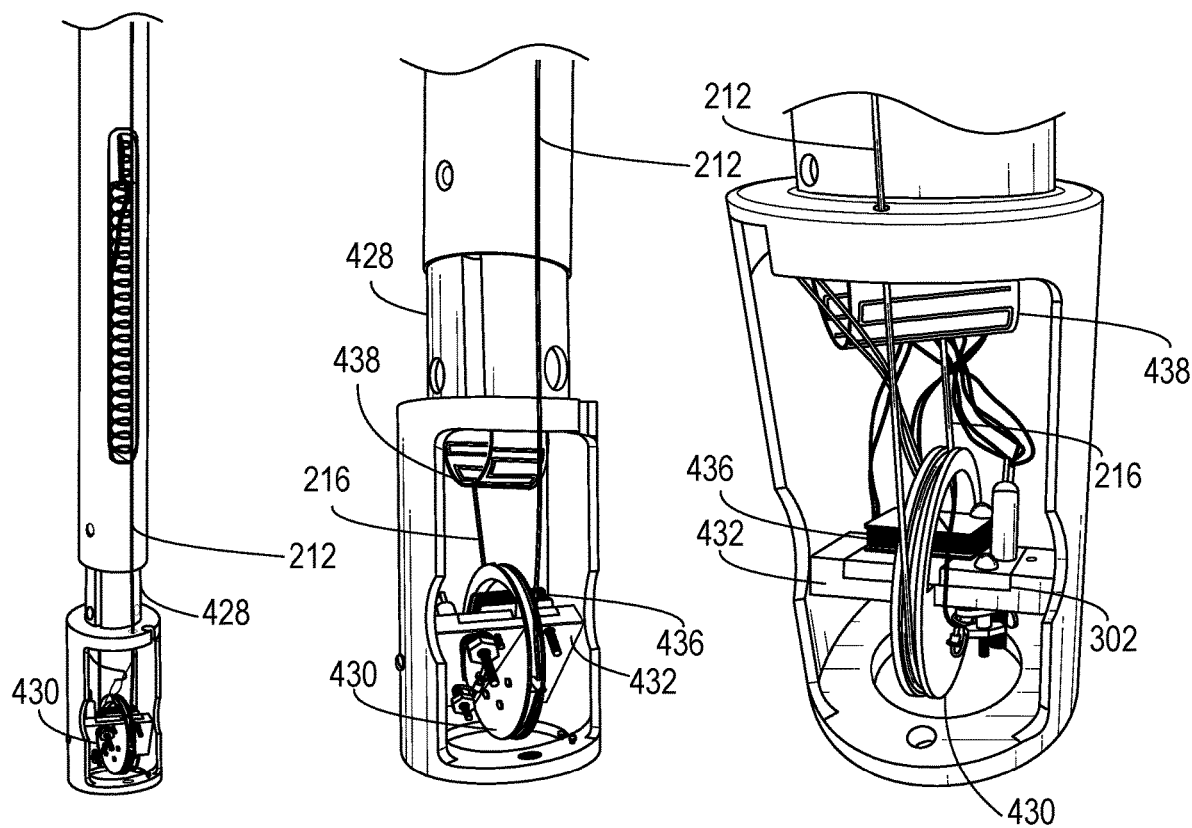
FIGS. 6A-C illustrate close-up depictions of various components of the magnetometer depicted in FIG. 4B in accordance with the principles of the present disclosure.

As shown in FIG. 4B, a lower portion 422 of a magnetometer 400 is shown. The lower portion 422 may include a stainless steel tubing 424 that connects the upper portion 402 to the lower portion 422. The lower portion 422 may further include an aluminum shaft 426. In some embodiments, the aluminum shaft 426 may be a G-10 holder. The first line 414 may extend through the aluminum shaft 426, a yoke 428, and a rotatable spool 430. A more detailed view of the first line 414, the aluminum shaft 426, the yoke 428, and the rotatable spool 430 is additionally depicted in FIGS. 6A-C. The yoke 428 may be fitted with a thermometer and a heater. The rotator spool 430 may be further fitted with a thermometer, for example, thermometer 438, a heater, and a pickup coil. The rotatable spool 430 may further include a rotator platform 432 for containing a sample of the superconductor material, as shown in FIG. 6. In some embodiments, a pick-up coil 436, as depicted in FIG. 6C, may be disposed above the sample of the superconductor material, such that the pickup coil is capable of determining an angle between an external magnetic field and the sample of the superconductor material. The angle may be determined based on a voltage that is induced in the pickup coil, which may be proportional to the angle. When the magnetic field is being swept, the voltage may be proportional to $\cos(\theta)$. When the platform rotates the sample in a constant magnetic field, the voltage may be proportional to $\sin(\theta)$.

In some embodiments, the rotator platform 432 may be configured to be positioned in the center of the external magnetic field and may be disposed within a cryostat 434. The rotator platform 432 may be made of a non-magnetic polyamide material. In some embodiments, the rotator platform 432 may be suspended in the yoke 428, which may be non-magnetic. The rotator platform 432 may be suspended by two niva-points that are deep-seated in the yoke 428 and two V-shaped sapphire jewels placed at respective ends of the rotator platform 432 in order to facilitate low-friction rotation.

In some embodiments, the sample of the superconductor material may be of a 4 mm×15 mm dimension, and may be disposed in a 100 µm deep grove and covered by a flat piece of polyamide. The sample of the superconductor material may be attached to the rotator platform 432 with screws, while ensuring that the sample of the superconductor material remains intact. In other embodiments, the sample of the superconductor material may be attached to the rotator platform 432 with glue or by soldering. In some embodiments, the pickup coil 436 of the rotatable spool 430 may be placed parallel and above the sample of the superconductor material. The pickup coil may then rotate together with the rotator platform 432 in order to detect the angle between the external magnetic field and the sample of the superconductor material.

In some embodiments, the thermometer 438 of the rotator spool 430 may be located on the rotator platform 432 in order to control the temperature of the sample of the superconductor material. The thermometer 438 may be a Cernox thermometer. In some embodiments, the heater of the rotator spool 430 may be located on the rotator platform 432 in order to control the temperature of the sample of the superconductor material. The heater may be a 1 mm×1.5 mm×3 mm resistive heater. In some embodiments, the thermometer of the yoke 428 may be another Cernox thermometer, and the heater of the yoke 428 may be a 50 Ohm wire heater. The thermometer of the yoke 428 and the heater of the yoke 428 may be glued to the yoke 428 and may control the temperature inside the yoke 428 so as to suppress temperature gradients occurring on the sample of the superconductor material.

In some embodiments, the rotatable spool 430 may be a titanium spool having a diameter of 28 mm. The rotatable spool 430 may be configured to enable rotation of the sample of the superconductor material via movement of the actuator that extends or retracts the first line 414 and the second line. In some embodiments, the first line 414 and the second line may be several centimeters long such that their length slightly exceeds the circumference of the rotatable spool 430. The first line 414 and the second line may be connected to aluminum rods to improve angle control of the sample of the superconductor material. In some embodiments, aluminum or other similar materials may be preferred because they are not magnetic. The aluminum rods may be approximately 1.5 meters long and may have a diameter of approximately 0.125 inches.

In some embodiments, the actuator 404 may be configured to provide a 4-inch range of linear movement in order to rotate the rotatable platform 432 at least 360 degrees. In some embodiments, the rotation of a microscrew of the actuator 404 by one division may yield a 0.001 inch linear movement that corresponds to a 2.7 degree rotation of the rotatable platform 432. The actuator 404 and the motor 406 may be configured to rotate the rotatable platform 432 in increments of less than 0.01 degrees.

In some embodiments, the holder of the sample of the superconductor material may be placed in the center of a magnetic field of either a 15 T superconducting magnet or a 31 T resistive magnet having an cold bore inner diameter of 39 mm. For example, the sample of the superconductor material may be disposed within the central bore of the magnet. At room temperature, the load cell 410 may be disposed above the magnet (either the 15 T superconducting magnet or the 31 T resistive magnet). For example, the load cell 410 may be located 1.6 meters above the center of the magnet. Such a configuration may serve to substantially suppress strong mechanical and electromagnetic interferences generated by high-power resistive magnets, for example, 20 MW resistive magnets, thus increasing the signal-to-noise ratio. A sample probe having an outer diameter of 35 mm may be placed in a vacuum can, for example, the vacuum can 118 depicted in FIG. 1, having a regulated amount of helium exchange gas or directly in liquid helium. In some embodiments, the outer diameter of the yoke 428 may be approximately 1.25 inches or 31.75 mm. It should be noted that measurements at magnetic fields above 31 T are possible if the holder of the sample of the superconductor material is reduced to have an outer diameter of 20 mm. It should further be noted that precise temperature control may be maintained from, for example, 4.2 K to 100 K.

As shown in FIGS. 7A-B, a magnetometer 700 may be mounted in a high-field cryostat 702C after the magnetometer 700 has been pre-cooled in a liquid nitrogen canister. For example, the high-field cryostat may have a 32 T resistive magnet. In some embodiments, the cryostat 702C may be disposed within a hole 702A contained within a platform 702B. FIG. 7B further depicts a tail 704 of the cryostat 702C, thus demonstrating the space limitation at high magnetic fields. For example, the tail may be over 3 feet in length, while maintaining an inner diameter of 1.5 inches. The lower portion of the magnetometer 700 may be inserted into the tail 704 of the cryostat 702C in order for measurements to be taken.

Figure 8A:
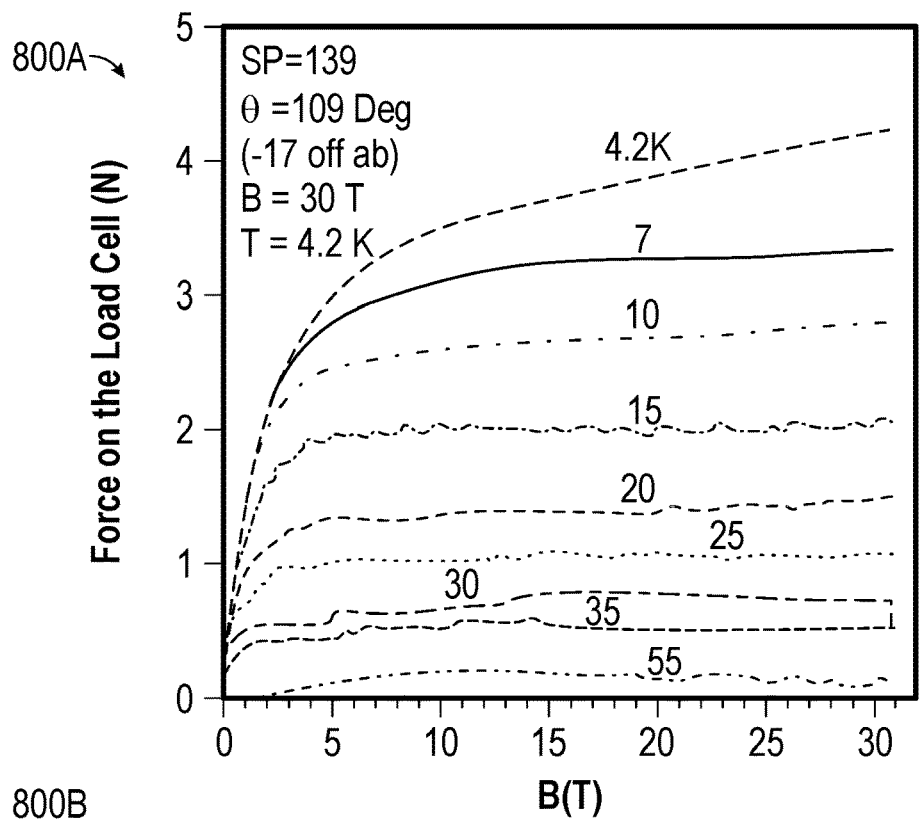
FIG. 8A illustrates a graph of the forces exerted on a load cell by a 14 mm×4 mm typical 2G high temperature superconductor sample in a tilted versus magnetic field at various temperatures in accordance with the principles of the present disclosure.

FIG. 8A illustrates a graph 800A of the forces exerted on a load cell, for example, the load cell 410 depicted in FIG. 4A, by a 14 mm×4 mm typical 2G high temperature superconductor sample in a tilted versus magnetic field (where θ=109 degrees, that is, the magnetic field is tilted 17 degrees from the sample's ab-plane, at various temperatures when the field is swept. These data points may be extracted from typical hysteresis curves. These data points further correspond well with the results obtained by typical four-probe critical current measurements, where available. However, unlike the four-probe transport technique, torque magnetometers in accordance with the present disclosure are an excellent tool for measurements in low magnetic field environments, where the critical current is significantly high and cannot be delivered to the sample of the superconductor material without inducing a temperature change. The torque measurements reflected in FIG. 8A were obtained in only two hours of field sweeps at a rate of 10 T/min. During these two hours, only 5 liters of liquid helium and 10 MWh of energy (for resistive magnet power) were consumed. The torque magnetometer used to obtain these measurements thus decreased the resource consumption required for obtaining the same sets of measurements by a factor of 20 as compared to the four-probe transport method. Notably, the torque measurements reflected in FIG. 8A were also successful at various temperatures, including lower temperatures of 4.2 K, 7 K, and 10 K, which have been relatively unsuccessful when measured via other methods.

Figure 8B:
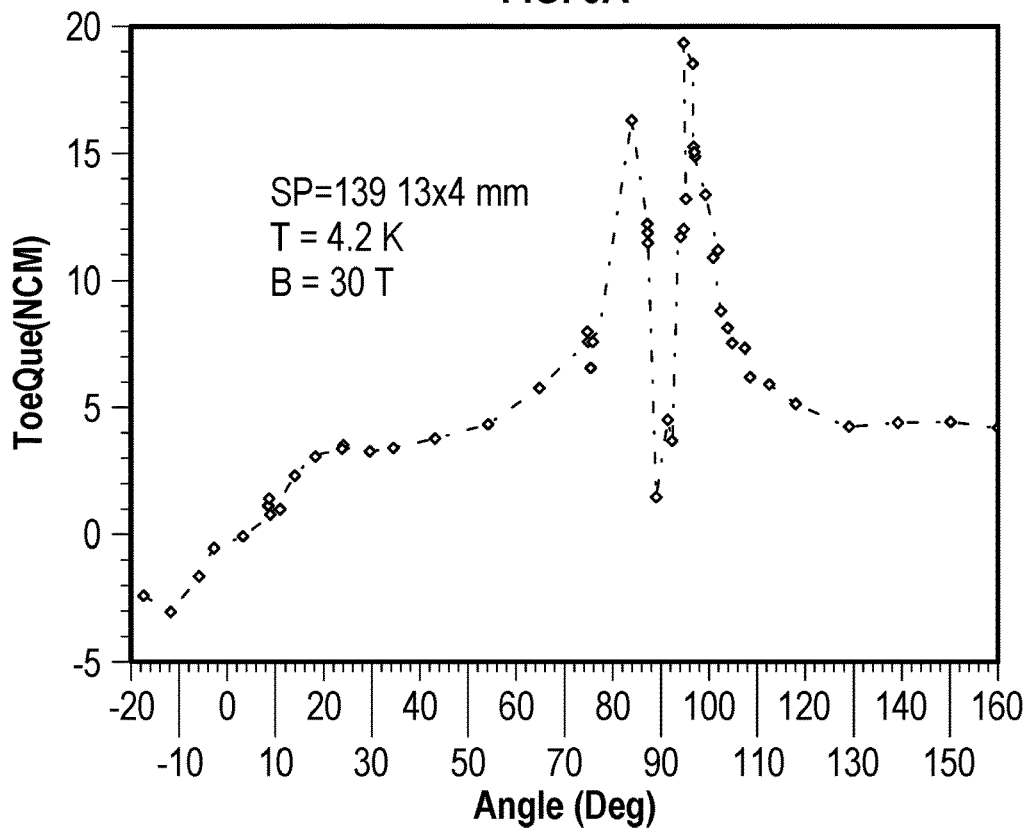
FIG. 8B depicts a graph of the variation in torque exerted at various angles associated with the sample of the superconductor material in accordance with the principles of the present disclosure.

FIG. 8B illustrates a graph 800B of the variation in torque exerted at various angles associated with the sample of the superconductor material. In this instance, the measurements were performed in liquid helium and at a high magnetic field of 30 T and at a temperature of 4.2 K. The variation in torque exerted illustrates the significant magnitude of the forces arising within a rare-earth barium copper oxide (REBCO) magnet. This is because a 5 Newton centimeter (Ncm) torque corresponds to a 35 N force being exerted on an edge of the sample of the superconductor material. Notably, the torque vanishes at θ≈3 degrees, which is not when the magnetic field is perpendicular to the sample's plane, but rather, when it is perpendicular to the sample's crystallographic ab-plane. This is because REBCO is grown on tilted substrates and the torque measurement can identify the direction of the tilt in a given sample of a superconductor material. This identification cannot be made by transport measurements performed around the c-axis, because the critical current has a rather smooth maximum (or minimum) at this angle, which does not necessarily correspond to the crystallographic direction. However, the tilt can still be identified by transport measurements from the sharp maximum appearing around the ab-axis, although transport measurements in this region are extremely difficult due to the very high critical currents carried by the coated conductors in this configuration.

It is further noteworthy that torque is observed to decrease at approximately ±6 degrees around the ab-plane ($\theta$=0), where the critical current displays a very well known, very sharp maximum. The primary reason for this discrepancy is that screening currents are induced by magnetic field sweeps, and so a fully-penetrated critical state current flow cannot be established at these angles. In other words, the current is strong enough to completely screen part of the sample of the superconductor material. Indeed, for a critical current density of Jc=40 MA/cm$^2$, the screening currents produce a magnetic field of approximately 4 T, while the perpendicular component of the field is $B_{perp}=B_{tot}\cos(\theta)$=3 T for a magnetic field of 30 T and a sample tilt of $\theta$=84 degrees. Other factors can affect the torque as well. As an example, if the sample of the superconductor material is not ideally flat, two loops of current may be induced in the sample. The two loops of current then produce opposite torques when the magnetic field is parallel to the sample plane, thus lowering the total torque on the sample of the superconductor material. Further, a fully critical state with magnetization parallel to the in-plane component $B_\parallel$ of the magnetic field may be induced in at least parts of the sample of the superconductor material. Nevertheless, reduced screening currents and torque around $\theta$=90 degrees are beneficial for magnet performance.

Figure 9:
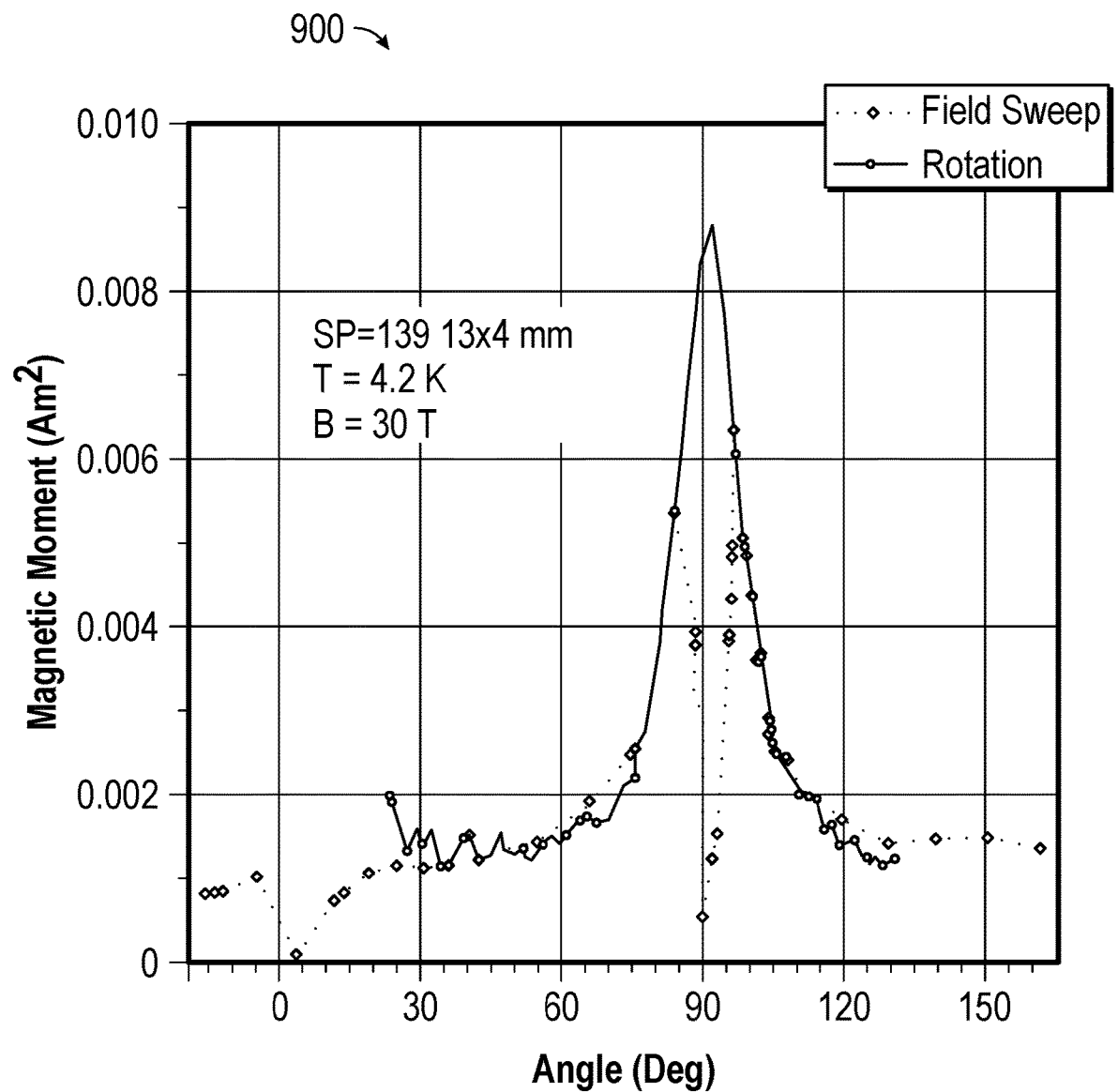
FIG. 9 illustrates a graph of the variation in magnetic moment of a sample of a superconductor material when the sample is rotated in a 30 T magnetic field at 4.2 K in accordance with the principles of the present disclosure.

FIG. 9 illustrates a graph of the variation in magnetic moment 900 of a sample of a superconductor material when the sample is rotated 180 degrees in a 30 T magnetic field at 4.2 K. It should be noted that the solid line on the graph of FIG. 9 is indicative of the magnetic moment due to rotation of the sample of the superconductor material, while the dotted line is indicative of data obtained from field sweeps from a first magnetic field to a second magnetic field at a constant rate.

Figure 10A:
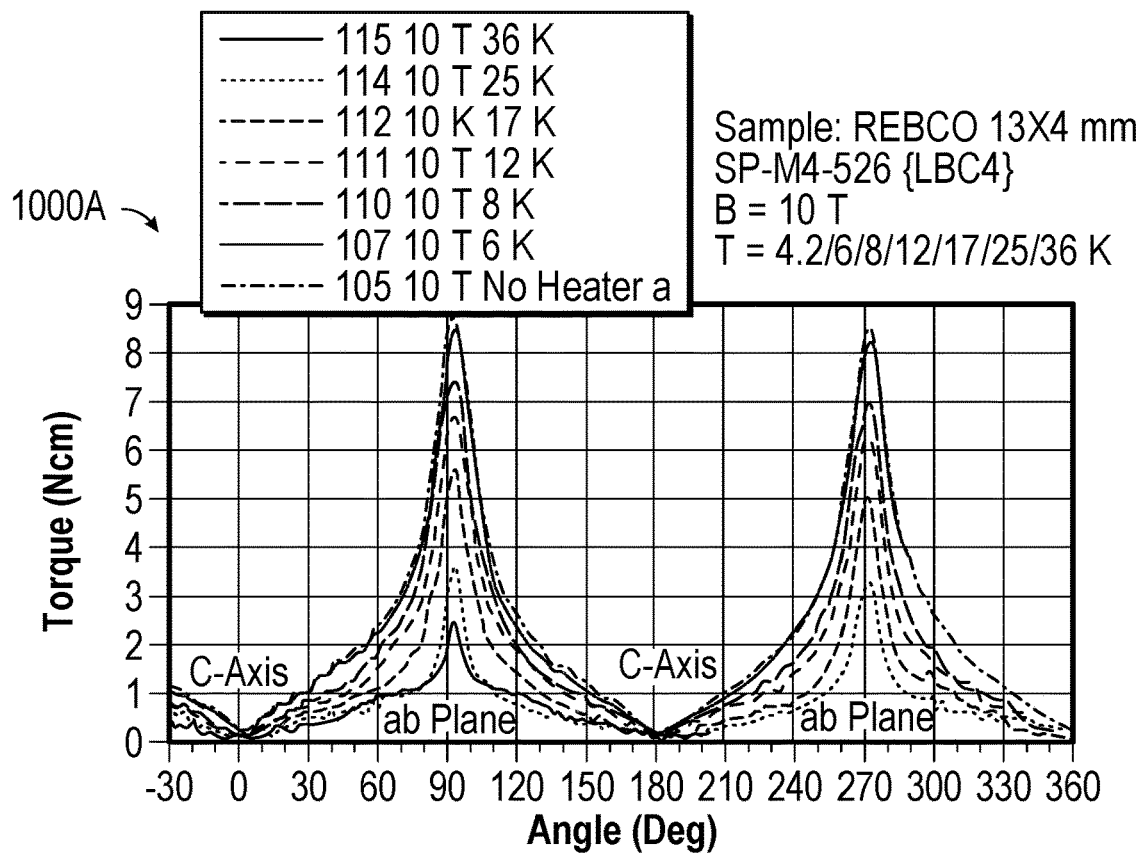
FIG. 10A depicts a graph reflecting data associated with torque calculations at various angles of the sample of the superconductor material at various temperatures in accordance with the principles of the present disclosure.

FIG. 10A illustrates a graph 1000A reflecting data associated with torque calculations at various angles, ranging from −30 to 360 degrees, of the sample of the superconductor material at various temperatures, as represented by the individual plot lines. In this instance, the magnetic field is configured to remain constant at 10T, while temperatures may vary from 4 K to 35 K. It should be noted that torque is calculated to reach its minimum at zero when the magnetic field is parallel to the c-axis. In order to determine torque, a voltage on the load cell may be directly measured, and a tension on the first line may be calculated according to the voltage and the load cell calibration. The torque may then be calculated by multiplying tension by the radius of the rotatable spool. In some embodiments, the torque may be adjusted by the counterweight and applicable forces (e.g., friction) so as to set the minimum torque at zero when the magnetic field is parallel to the c-axis.

Figure 10B:
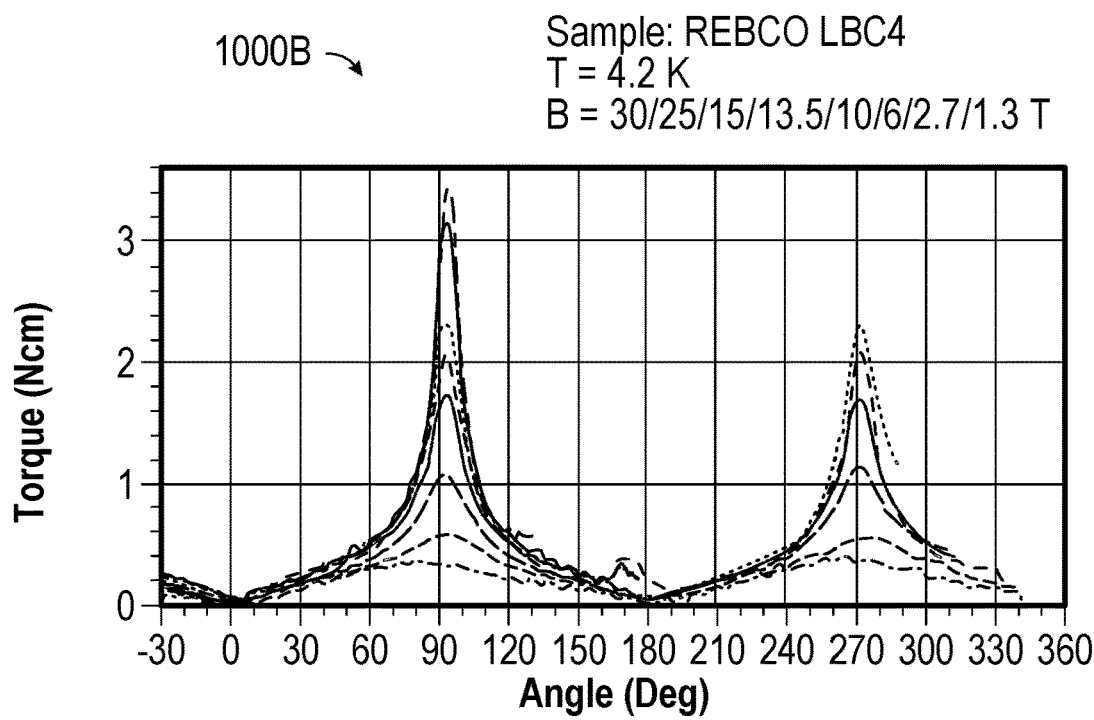
FIG. 10B depicts a graph reflecting data associated with torque calculations at various angles of the sample of the superconductor material at various magnetic fields in accordance with the principles of the present disclosure.

FIG. 10B illustrates a graph 1000B reflecting data associated with torque calculations at various angles, ranging from −30 to 270 degrees, of the sample of the superconductor material at various magnetic fields, as represented by the individual plot lines. In this instance, the temperature is configured to remain constant at 4.2 K. Notably, the ability to measure torque in high magnetic fields at an angle of approximately 90 degrees is limited in other methods, while the magnetometer has been successful in performing such measurements.

Figure 11A:
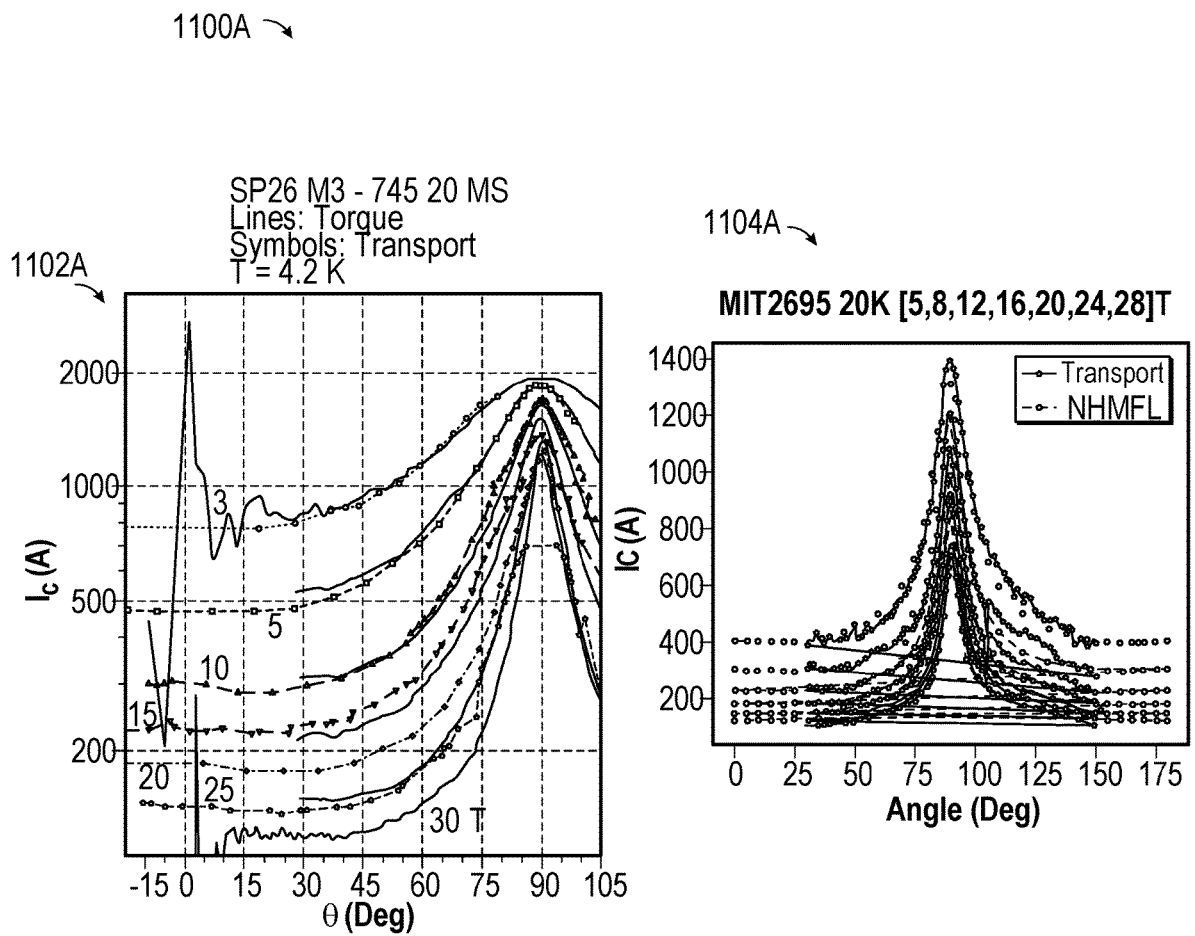
FIG. 11A depicts a graph that reflects the agreement between data obtained via a torque magnetometer and data obtained via the four-probe transport method in accordance with the principles of the present disclosure.

FIG. 11A illustrates a graph that reflect the agreement between data obtained via a torque magnetometer in accordance with the present disclosure and data obtained via the four-probe transport method in the prior art. The illustrated graph 1102A in FIG. 11A depicts data associated with critical current calculations at various angles of the sample of the superconductor material at various magnetic fields ranging from 3 T to 30 T obtained using systems and methods according to the present disclosure. In this instance, the temperature is configured to remain constant at 4.2 K. It should be noted that the solid lines on the graph represent data obtained via the torque magnetometer, and that the dotted lines on the graph represent data obtained via the four-probe transport method. As can be seen in the graph 1104A in FIG. 11A, there is little variation in the data collected via the torque magnetometer and the data collected via the four-probe transport method.

Figure 11B:
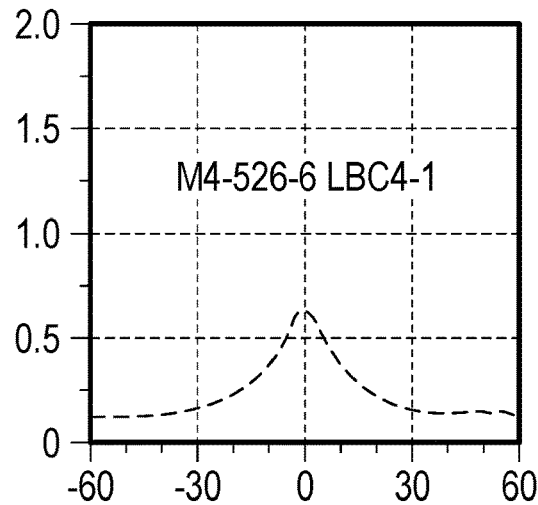
FIG. 11B depicts graphical data associated with angular critical currents at various magnetic fields of up to 30 T in accordance with the principles of the present disclosure.
Figure 11B:
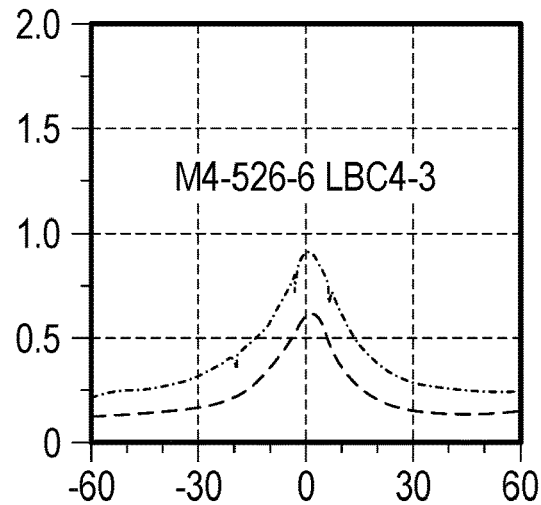
Figure 11B:
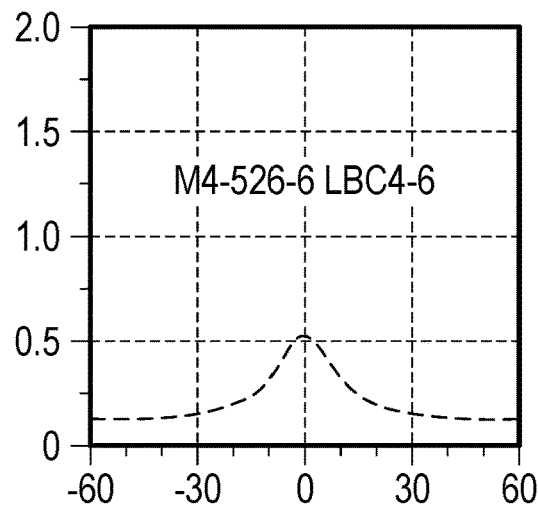
Figure 11B:
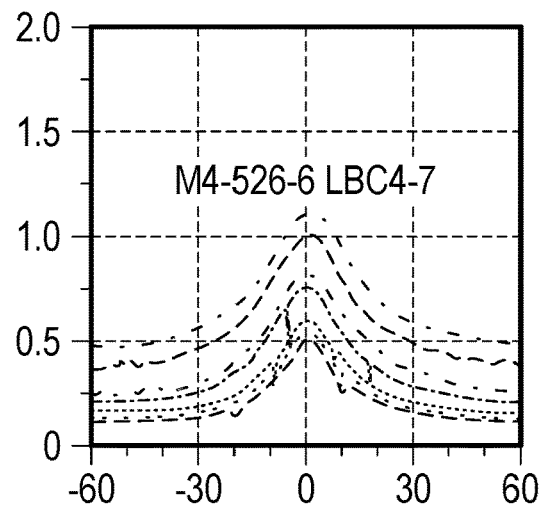
Figure 11B:
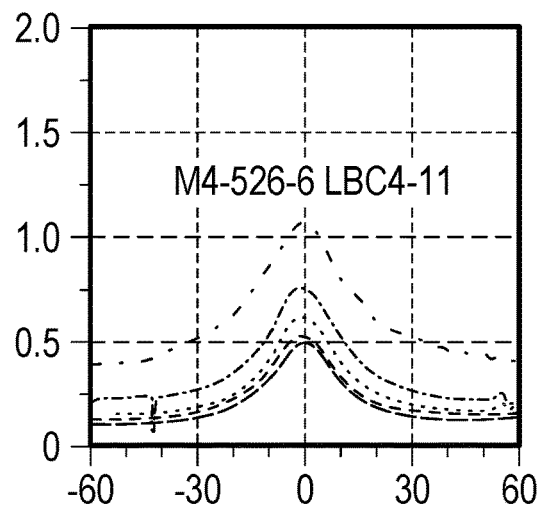
Figure 11B:
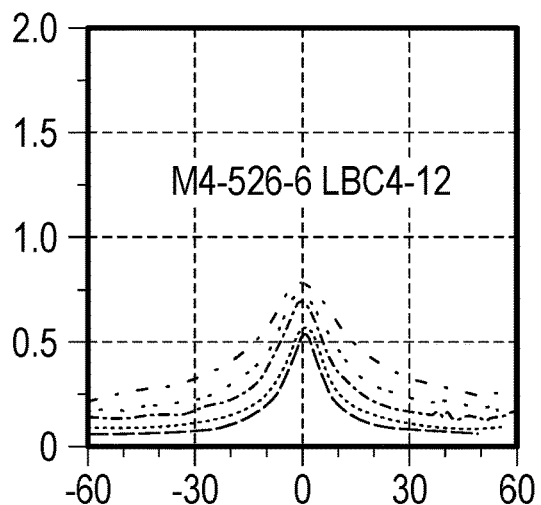
Figure 11B:
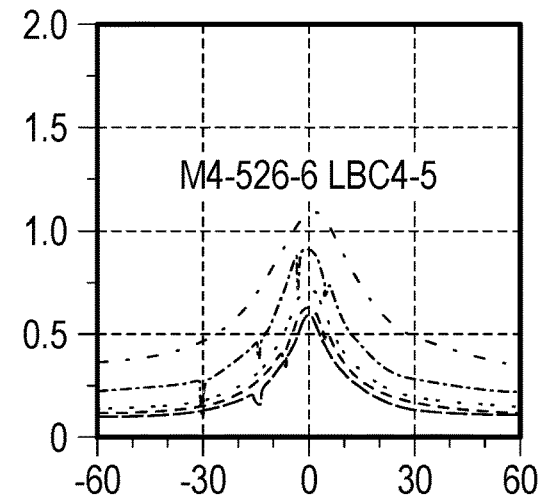
Figure 11B:
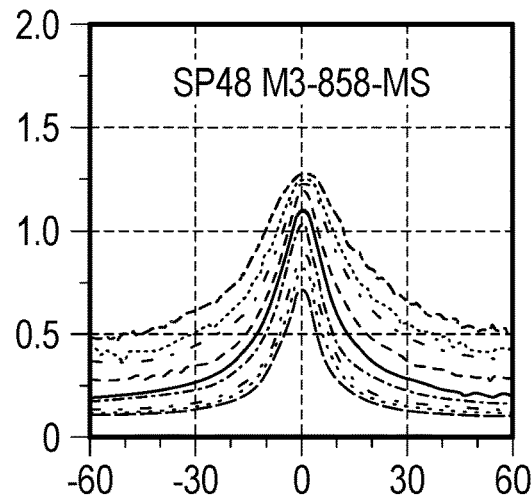
Figure 11B:
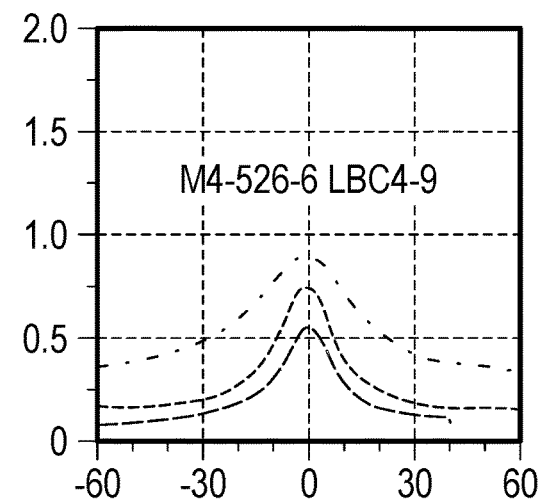
Figure 11B:
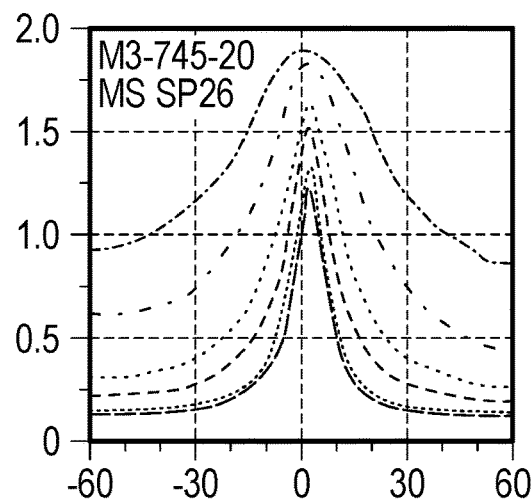
Figure 11B:
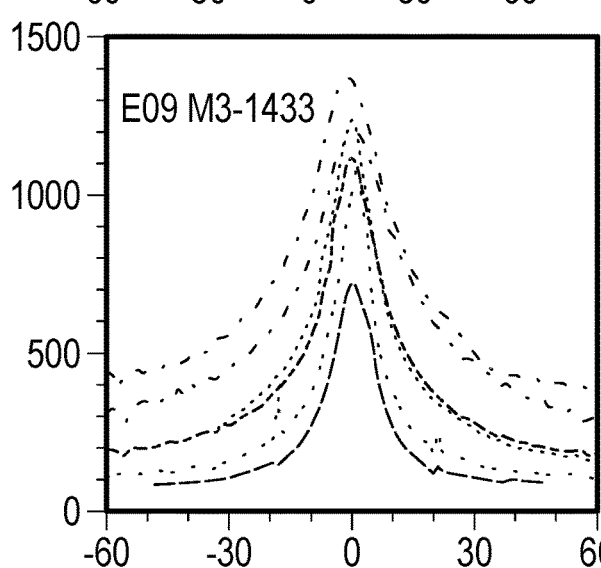
Figure 11B:
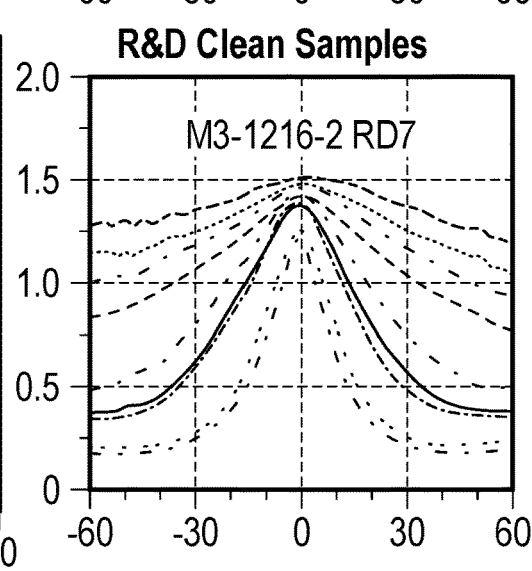
Figure 11B:
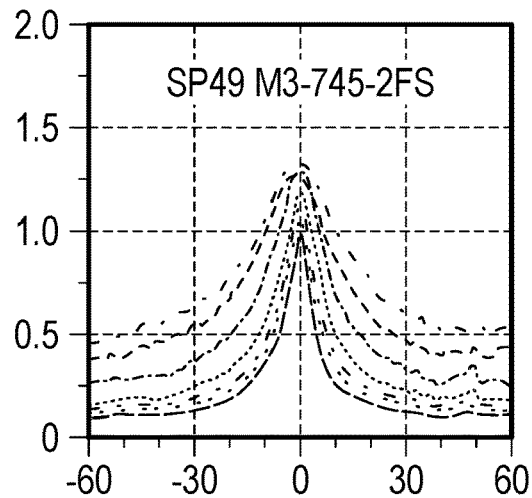
Figure 11B:
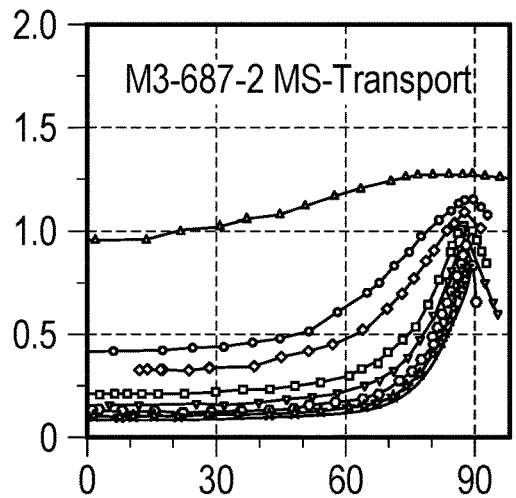
Figure 11B:
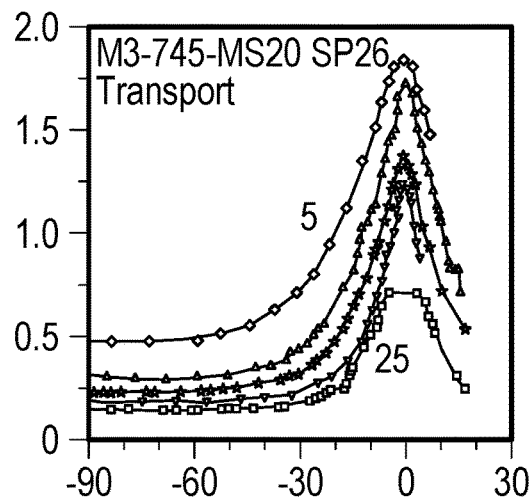
Figure 11B:
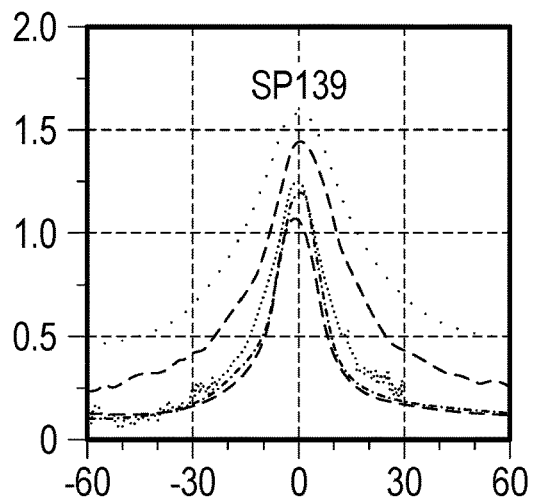
Figure 11B:
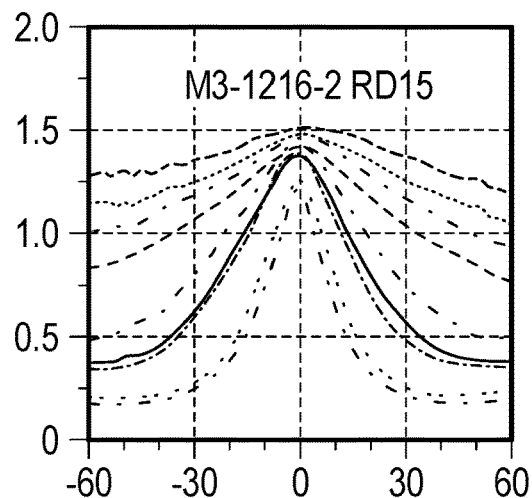
Figure 11B:
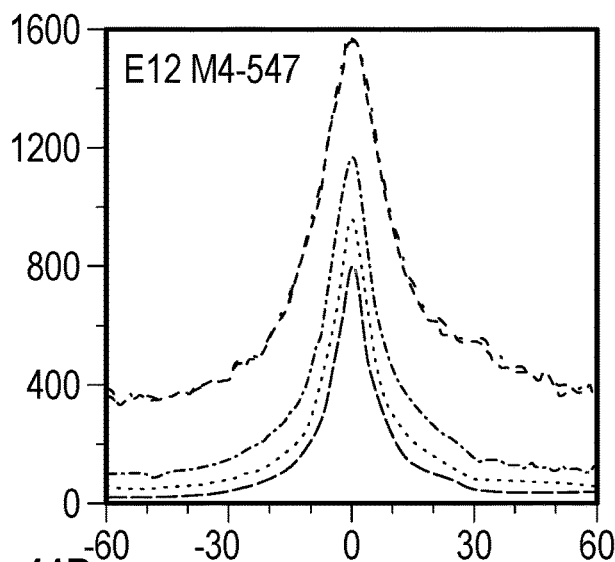
Figure 11B:
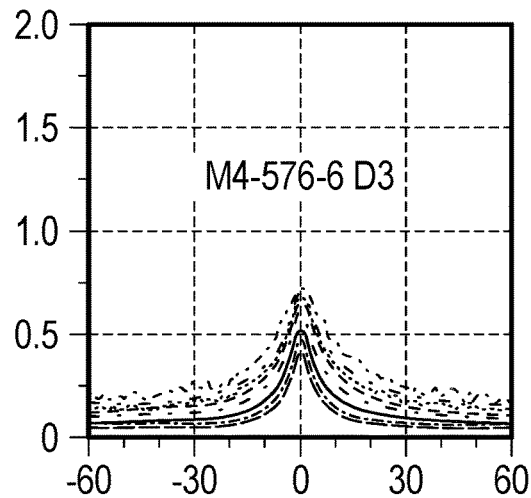
Figure 11B:
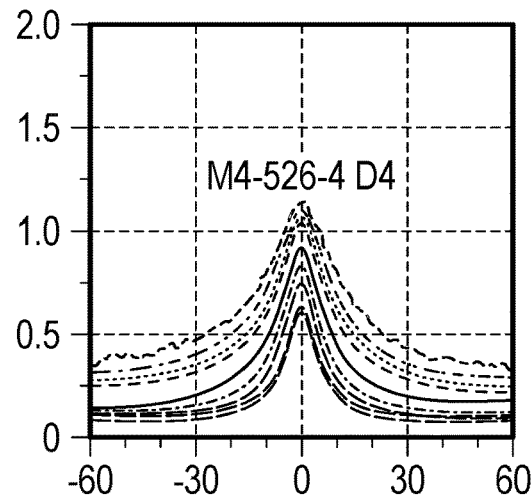
Figure 11B:
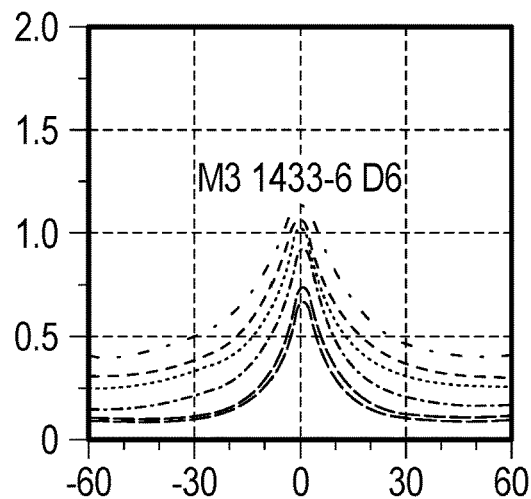
Figure 11B:
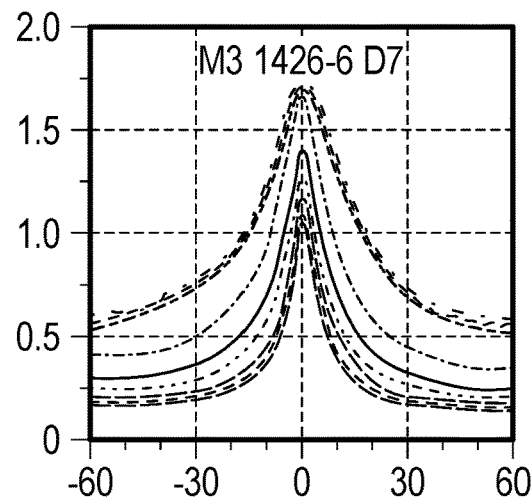
Figure 11B:
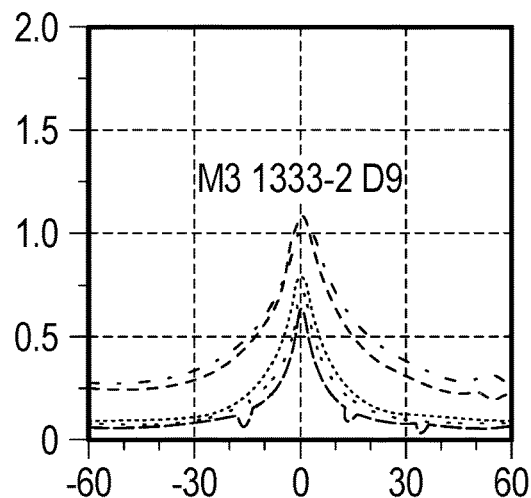
Figure 11B:
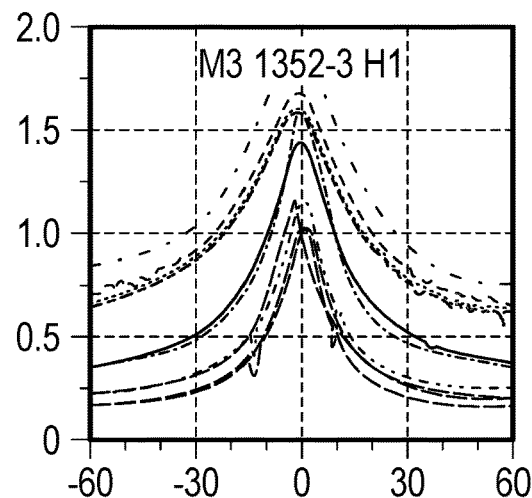
Figure 11B:
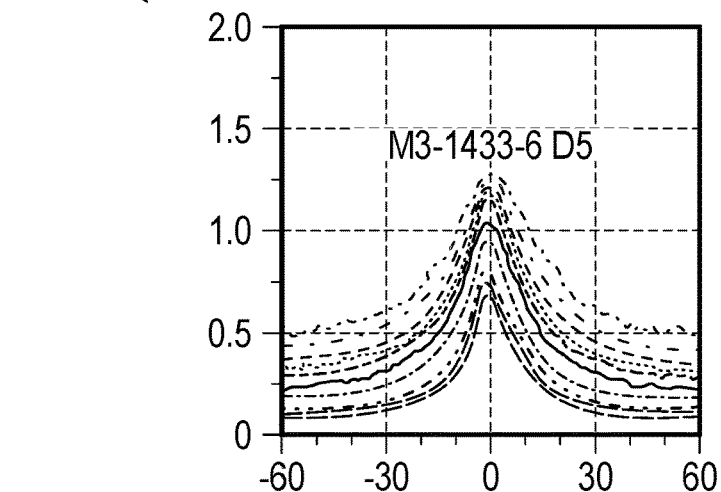
Figure 11B:
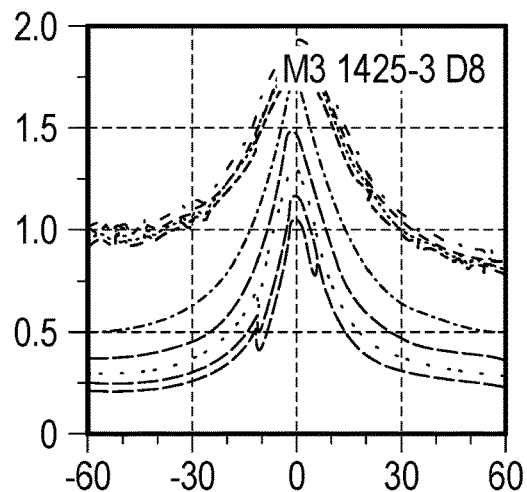
Figure 11B:
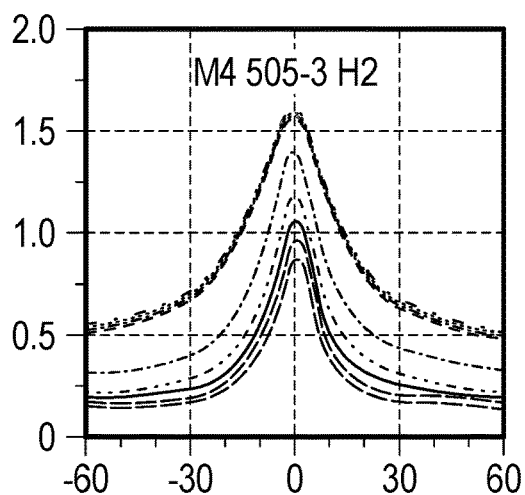

FIG. 11B depicts graphical data 1100B associated with angular critical currents at various magnetic fields of up to 30 T. The system's ability of rapidly assess angular critical current renders it possible for large numbers of samples to be characterized in an economical way. More specifically, the graphical data 1100B was collected over 120 to 150 hours and involved various superconductor materials being tested in 30 T magnetic fields. The various superconductor materials were better characterized based on the various critical currents and angular dependences observed during testing.

Figure 12:
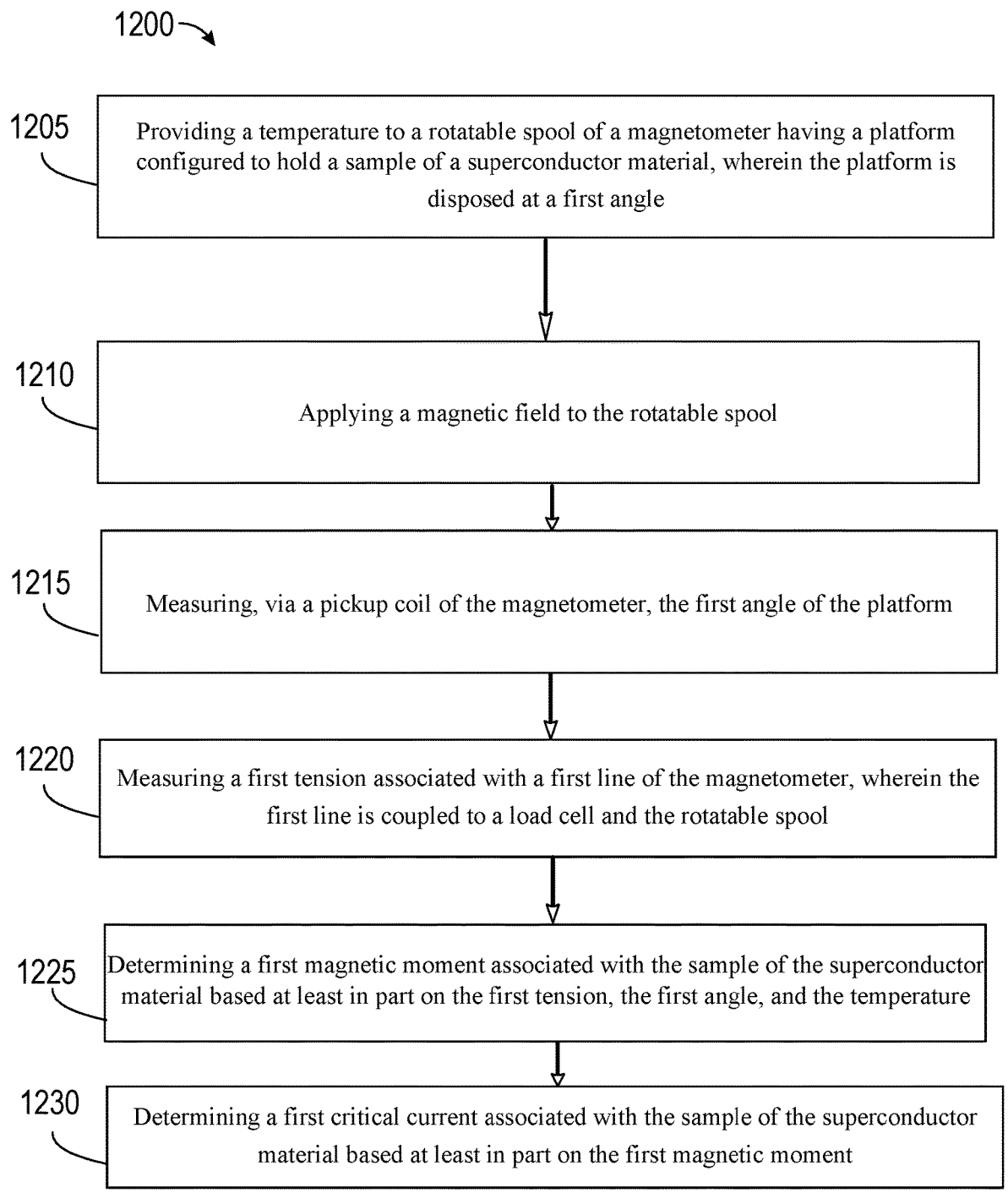
FIG. 12 depicts a flow chart of an example method of determining a critical current associated with a sample of a superconductive material in accordance with the principles of the present disclosure.

FIG. 12 shows a flow chart 1200 of an example method of determining a critical current associated with a sample of a superconductive material in accordance with the disclosure. The flow chart 1200 illustrates a sequence of operations that can be implemented in hardware, software, or a combination thereof, such as a magnetometer in accordance with the present disclosure. In the context of software, the operations represent computer-executable instructions stored on one or more non-transitory computer-readable media such as a memory, for example, the memory in the computer described in FIG. 2, that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations may be carried out in a different order, omitted, combined in any order, and/or carried out in parallel. Some or all of the operations described in the flow chart 1200 may be carried out either independently or in cooperation with other devices such as, for example, a computer.

At block 1205, a temperature may be provided to a rotatable spool of a magnetometer having a platform configured to hold a sample of a superconductor material, wherein the platform is disposed at a first angle. The first angle may be defined by the operation of an actuator, and measured by a pickup coil. In some embodiments, the temperature may be provided by inserting a lower portion of the magnetometer into a cryostat and/or by using one or more heaters located or adjacent to the platform. At block 1210, a magnetic field may be applied to the rotatable spool. At block 1215, a pickup coil of the magnetometer may measure the first angle of the platform. At block 1220, a first tension associated with a first line of the magnetometer may be measured, where the first line is coupled to the rotatable spool and a load cell of the magnetometer. At block 1225, a first magnetic moment associated with the sample of the superconductor material may be determined based at least in part on the first tension, the first magnetic field, the first angle, and the temperature. In some embodiments, the first magnetic moment may be determined by a computer that is communicatively coupled to the magnetometer. At block 1230, a first critical current associated with the sample of the superconductor material may be determined based at least in part on the first magnetic moment. In some embodiments, the first critical current may be determined by a computer that is communicatively coupled to the magnetometer.

In some embodiments, the platform may be rotated to be disposed at a second angle. The second angle of the platform may be measured via the pickup coil of the magnetometer. A second tension associated with the first line of the magnetometer may be measured, and a second magnetic moment associated with the sample of the superconductor material based at least in part on the second tension, the second angle, and the temperature may be determined. A second critical current associated with the sample of the superconductor material may be determined based at least in part on the second magnetic moment, and the platform may then be rotated to be disposed at a third angle.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described example embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

What is claimed:

1. A magnetometer comprising:
    an actuator driven by a motor;
    a load cell coupled to the actuator;
    a rotatable spool having a platform configured to hold a sample of a superconductor material, wherein the rotatable spool is coupled to the load cell by a first line;
    a pulley; and
    a second line extending between the rotatable spool and a counterweight, wherein the second line is positioned on the pulley,
    wherein movement of the actuator causes the rotatable spool to rotate an angle of the platform relative to a magnetic field about the rotatable spool,
    and wherein the load cell is configured to measure a tension on the first line.

2. The magnetometer of claim 1, further comprising:
    a processor configured to determine a critical current of the superconductor material based on tension measurements in the first line.

3. The magnetometer of claim 1, further comprising:
    a pickup coil disposed adjacent the sample of the superconductor material, wherein the pickup coil is configured to determine an angle between the magnetic field and the sample of the superconductor material.

4. The magnetometer of claim 1, wherein the actuator is configured to rotate the platform in increments of less than 0.01 degrees.

5. The magnetometer of claim 1, further comprising: a processor having a memory configured to:
    calculate a torque based on the tension in the first line, a radius of the pulley, and a weight of the counterweight; and
    calculate a magnetic moment based on the torque, the magnetic field, and the angle of the platform relative to the magnetic field.

6. The magnetometer of claim 1, wherein the rotatable spool and the platform are disposed inside a cryostat.

7. The magnetometer of claim 1, wherein the rotatable spool includes a first thermometer and a first heater.

8. The magnetometer of claim 7, further comprising a yoke having a second thermometer and a second heater, wherein the first line extends through the yoke.

9. A system configured for determining a magnetic moment associated with a sample of a superconductor material, comprising:
    a magnetometer, comprising:
        an actuator driven by a motor;
        a load cell coupled to the actuator;
        a rotatable spool having a platform configured to hold a sample of a superconductor material, wherein the rotatable spool is coupled to the load cell by a first line;
        a pulley; and
        a second line extending between the rotatable spool and a counterweight, wherein the second line is positioned on the pulley,
        wherein movement of the actuator causes the rotatable spool to rotate an angle of the platform relative to a magnetic field about the rotatable spool,
        and wherein the load cell is configured to measure a tension on the first line.

10. The system of claim 9, wherein the magnetometer further comprises a processor configured to determine a critical current of the superconductor material based on tension measurements in the first line.

11. The system of claim 9, wherein the magnetometer further comprises a pickup coil disposed adjacent the sample of the superconductor material, wherein the pickup coil is configured to determine an angle between the magnetic field and the sample of the superconductor material.

12. The system of claim 9, wherein the actuator is configured to rotate the platform in increments of less than 0.01 degrees.

13. The system of claim 9, further comprising: a processor having a memory configured to:
   calculate a torque based on the tension in the first line, a radius of the pulley, and a weight of the counterweight; and
   calculate a magnetic moment based on the torque, the magnetic field, and the angle of the platform relative to the magnetic field.

14. The system of claim 9, wherein the rotatable spool and the platform are disposed inside a high-field cryostat.

15. The system of claim 9, wherein the rotatable spool includes a first thermometer and a first heater.

16. The system of claim 15, further comprising a yoke having a second thermometer and a second heater, wherein the first line extends through the yoke.

17. A method comprising:
   providing a temperature to a rotatable spool of a magnetometer having a platform configured to hold a sample of a superconductor material, wherein the platform is disposed at a first angle;
   applying a magnetic field to the rotatable spool;
   measuring, via a pickup coil of the magnetometer, the first angle of the platform;
   measuring a first tension associated with a first line of the magnetometer, wherein the first line is coupled to a load cell of the magnetometer and the rotatable spool;
   determining a first magnetic moment associated with the sample of the superconductor material based at least in part on the first tension, the first angle, and the temperature; and
   determining a first critical current associated with the sample of the superconductor material based at least in part on the first magnetic moment.

18. The method of claim 17, further comprising:
   rotating the platform to be disposed at a second angle;
   measuring, via the pickup coil of the magnetometer, the second angle of the platform;
   measuring a second tension associated with the first line of the magnetometer;
   determining a second magnetic moment associated with the sample of the superconductor material based at least in part on the second tension, the second angle, and the temperature;
   determining a second critical current associated with the sample of the superconductor material based at least in part on the second magnetic moment; and
   rotating the platform to be disposed at a third angle.

19. The method of claim 17, wherein the temperature is provided by a cryostat and/or one or more heaters disposed on or adjacent to the platform.

20. The method of claim 17, wherein the first critical current is determined at a computer that is communicatively coupled to the magnetometer.

* * * * *